United States Patent
Barth et al.

(10) Patent No.: US 8,557,045 B2
(45) Date of Patent: Oct. 15, 2013

(54) APPARATUS AND METHOD FOR FABRICATING PHOTOVOLTAIC MODULES USING HEATED POCKET DEPOSITION IN A VACUUM

(75) Inventors: Kurt L. Barth, Fort Collins, CO (US); Robert A. Enzenroth, Fort Collins, CO (US); Walajabad S. Sampath, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 777 days.

(21) Appl. No.: 12/198,675

(22) Filed: Aug. 26, 2008

(65) Prior Publication Data

US 2010/0055827 A1   Mar. 4, 2010

(51) Int. Cl.
C23C 16/00   (2006.01)

(52) U.S. Cl.
USPC .................. 118/726; 118/723 HC; 118/724; 427/592

(58) Field of Classification Search
USPC ............ 438/14; 118/726, 723 HC, 721–724; 427/592
See application file for complete search history.

(56) References Cited

U.S. PATENT DOCUMENTS

| 4,237,148 | A | * | 12/1980 | Aichert et al. | 427/597 |
| 4,325,986 | A | * | 4/1982 | Baron et al. | 438/62 |
| 6,830,626 | B1 | * | 12/2004 | Smith | 118/726 |
| 2002/0040682 | A1 | * | 4/2002 | Ramsay | 118/723 EB |
| 2004/0035360 | A1 | * | 2/2004 | Yamazaki et al. | 118/715 |
| 2004/0139914 | A1 | * | 7/2004 | Yamazaki et al. | 118/719 |
| 2005/0158891 | A1 | * | 7/2005 | Barth et al. | 438/22 |
| 2006/0162662 | A1 |  | 7/2006 | Sato et al. | |

* cited by examiner

Primary Examiner — H. Jey Tsai

(57) ABSTRACT

An apparatus and method for manufacturing thin-film CdS/CdTe photovoltaic modules in a vacuum environment. The apparatus deposits CdS and CdTe layers onto a substrate using heated pocket deposition, a form of physical vapor deposition (PVD) in which a material thermally sublimes from a thermal sublimation source block and is deposited onto a substrate. The thermal sublimation source block includes a pocket having a lower surface into which an array of holes is formed to house plugs of deposition material. Upon heating, deposition material sublimes from a surface of each plug of deposition material, and the surface of each plug regresses into its corresponding hole while maintaining a constant surface area. The sublimation surface area of deposition material across the pocket remains substantially constant during an extended deposition process, and the deposition material is substantially free of undesired thermal radiation from the substrate. As such, the thermal sublimation source block provides a temporally- and spatially-uniform thin film deposition rate across the lower surface of the substrate.

26 Claims, 17 Drawing Sheets

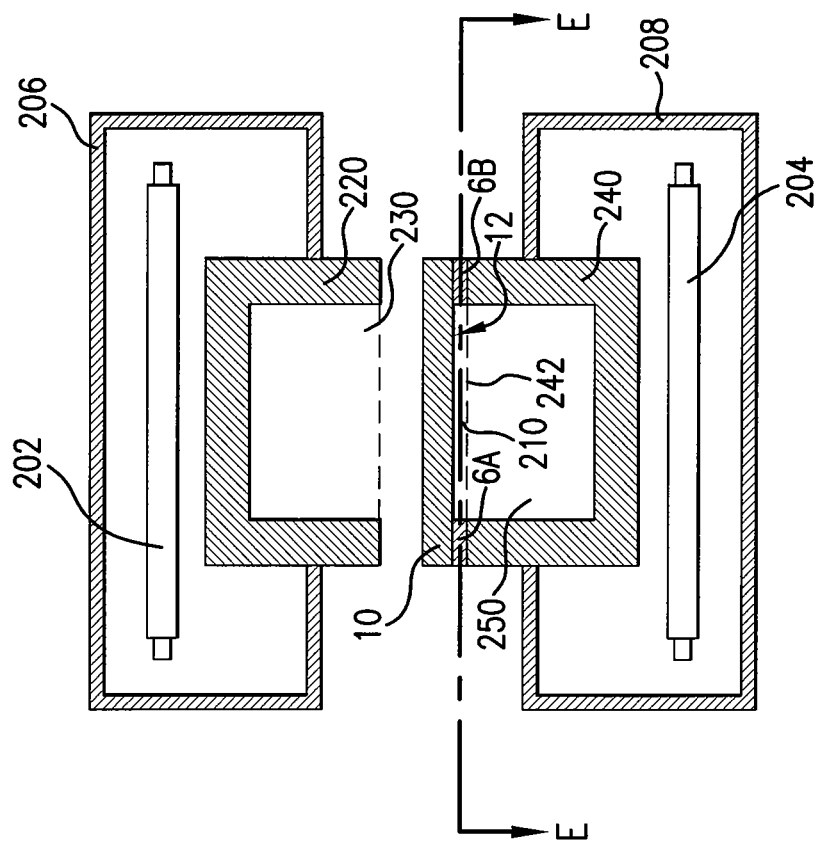
FIG.3A
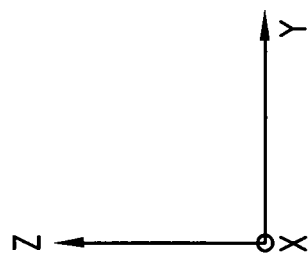

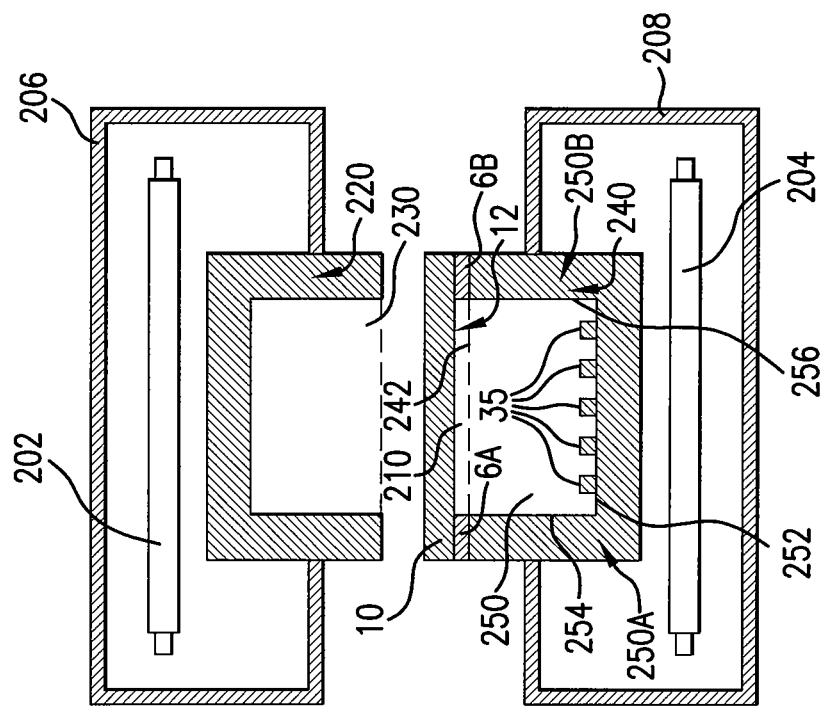
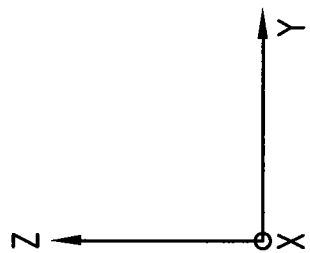
FIG.3C

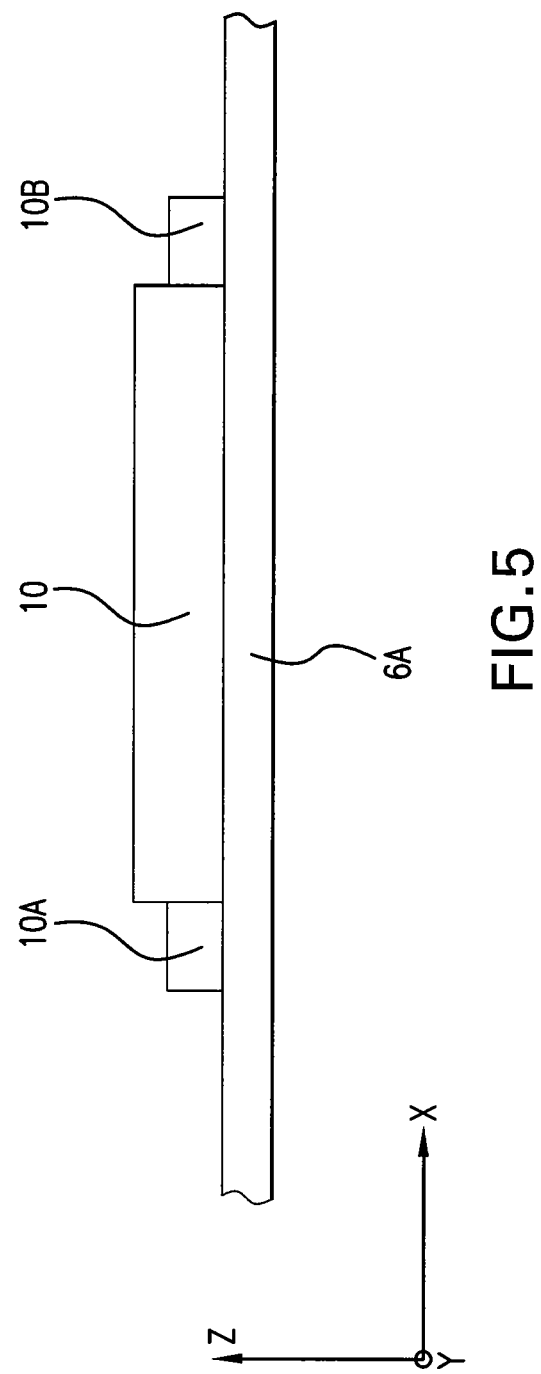

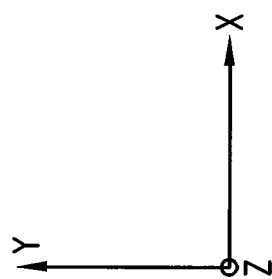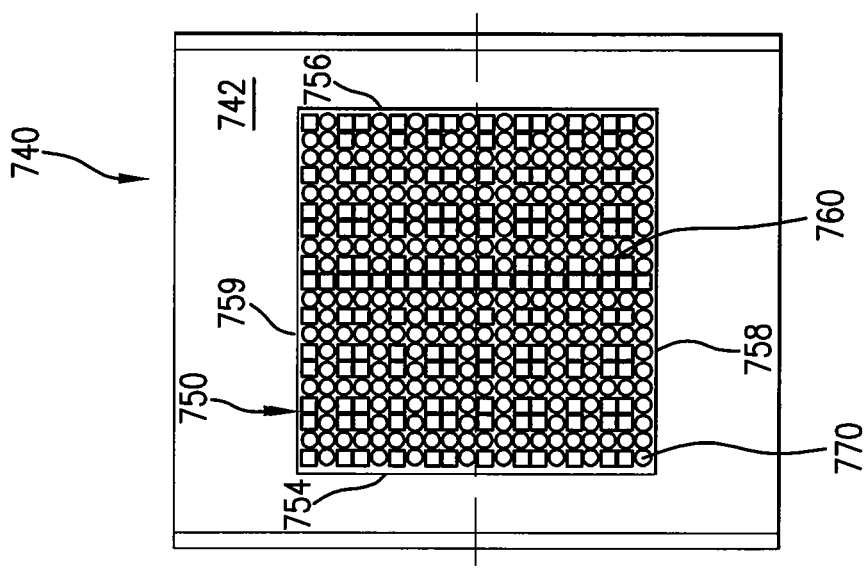

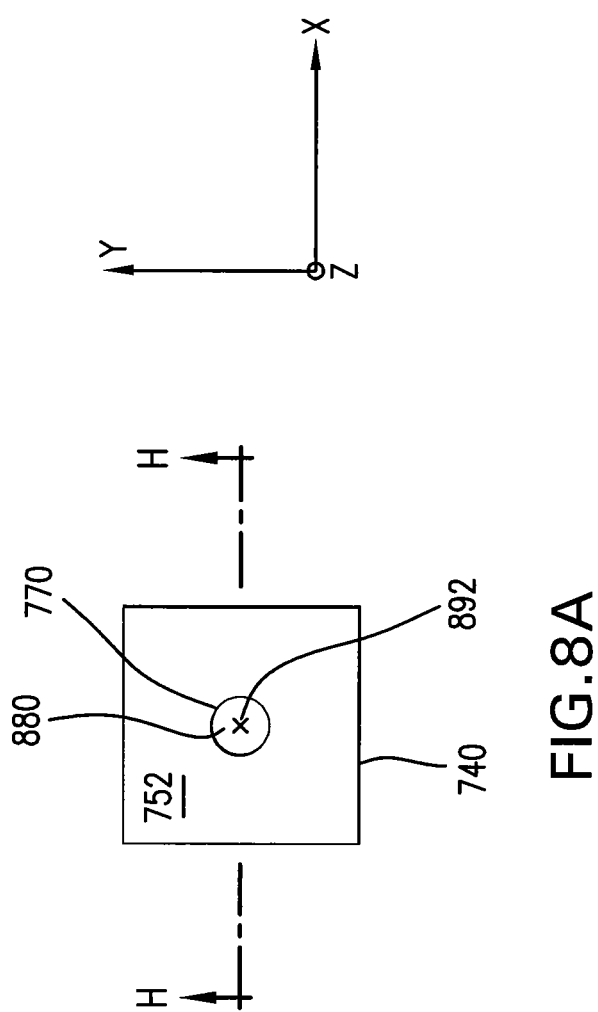

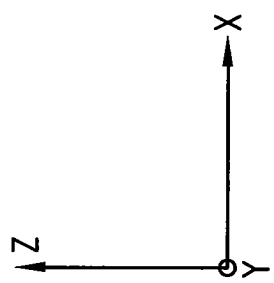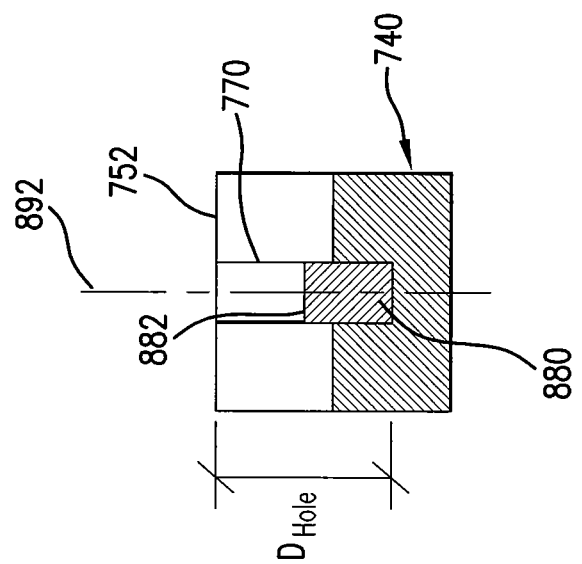
FIG.8B

APPARATUS AND METHOD FOR FABRICATING PHOTOVOLTAIC MODULES USING HEATED POCKET DEPOSITION IN A VACUUM

BACKGROUND

1. Field of the Invention

The present invention relates to apparatus and methods for manufacturing of thin-film photovoltaic modules in vacuum using physical vapor deposition.

2. Related Art

Photovoltaic (PV) modules convert solar energy into electricity through the photovoltaic effect. As such, photovoltaic modules represent a clean source of renewable energy in a global marketplace dominated by traditional fossil-fuel technologies, such as coal-fired and oil-fired power plants. However, to be a major source of energy within the global marketplace, PV modules must be manufactured as a commodity in quantities and at costs that are competitive with existing fossil fuel technologies.

One such PV module that satisfies the requirement of commodity manufacturing is a cadmium telluride (CdTe) PV module. CdTe PV modules generally take the form of thin film polycrystalline devices in which CdTe layer is paired with a cadmium sulfide (CdS) layer to form a hetero-junction. Although a variety of vacuum and non-vacuum processes can produce the thin films for a CdTe/CdS PV module, physical vapor deposition techniques, especially vacuum sublimation deposition of CdTe and CdS thin films, are especially amenable to the commodity manufacturing of CdTe/CdS PV modules. For example, vacuum sublimation of CdS and CdTe thin films can result in thin-film deposition rates ten to one hundred times higher than other suitable deposition techniques. Further, vacuum sublimation of the semiconductor layers in CdS/CdTe PV modules can be performed in modest levels of vacuum, thereby eliminating costly high-vacuum equipment common to existing deposition techniques.

SUMMARY

In one embodiment, there is provided a source block for exposing a substrate to sublimating vapor in a vacuum. A first surface of the source block disposed proximate to a surface of a heated substrate, and an open cavity formed into the first surface of the source block and extending into the source block to form a second surface, such that the second surface of the source block is substantially perpendicular to the first surface of the source block. A plurality of holes are formed into the second surface of the source block and respectively extend into the source block for a specified distance. Material is positioned within each of the plurality of holes to be sublimated during exposure of the substrate. The material in each of the plurality of holes has a corresponding initial sublimation surface area, and, during exposure of the substrate, a sublimation surface area of the material within each of the plurality of holes is substantially equivalent to the corresponding initial sublimation source. Further, the source block is configured such that radiative heat transfer between a portion of the surface of the substrate and the material within each of the plurality of holes is substantially constant during exposure of the substrate.

In an additional embodiment, there is provided processing station for exposing a substrate to sublimating vapor in a vacuum that includes a source block configured to expose a surface of a heated substrate to sublimating vapor. The source block has a first surface disposed proximate to a surface of the heated substrate and an open cavity formed into the first surface of the source block and extending into the source block to form a second surface such that the second surface of the source block being substantially perpendicular to the first surface. A plurality of holes are formed into the second surface and respectively extend into the source block for a specified distance. Further, material is positioned within each of the plurality of holes to be sublimated during exposure of the substrate, and the material in each of the plurality of holes has a corresponding initial sublimation surface area. The processing station also includes a heat source configured to apply a heat flux to the source block to sublimate the material within each of the plurality of holes, such that during exposure of the substrate, a sublimation surface area of the material within each of the plurality of holes is substantially equivalent to the corresponding initial sublimation source area. Further, the source block is configured such that radiative heat transfer between a portion of the surface of the substrate and the material within each of the plurality of holes is substantially constant during exposure of the substrate, and a rate of sublimation of the material within each of the plurality of holes is substantially constant during exposure of the substrate.

In a further embodiment, there is provided an apparatus for manufacturing a thin film photovoltaic module that includes a vacuum chamber having a plurality of vacuum processing stations configured to expose a heated substrate to a sublimating vapor. Each of the plurality of vacuum processing stations includes a source block configured to expose a surface of the heated substrate to the sublimating vapor, and the source block has a first surface disposed proximate to a surface of the heated substrate. A open cavity is formed into the first surface of the source block that extends into the source block to form a second surface, which is substantially perpendicular to the first surface. Further, a plurality of holes are formed into the second surface and respectively extend into the source block for a specified distance. Material is positioned within each of the plurality of holes to be sublimated during exposure of the substrate, and the material in each of the plurality of holes having a corresponding initial sublimation surface area. Each of the plurality of processing stations includes a heat source configured to apply a heat flux to the thermal sublimation source block to sublimate the material within each of the plurality of holes, such that during exposure of the substrate, a sublimation surface area of the material within each of the plurality of holes is substantially equivalent to the corresponding initial sublimation source area. Further, the source block is configured such that radiative heat transfer between a portion of the surface of the substrate and the material within each of the plurality of holes is substantially constant during exposure of the substrate, and a rate of sublimation of the material within each of the plurality of holes is substantially constant during exposure of the substrate. The apparatus also includes a substrate transport system configured to transfer the one or more substrates into the vacuum chamber prior to exposure to the sublimating vapor and to transfer the one or more substrates out of the vacuum chamber after exposure to the sublimating vapor and a plurality of additional processing stations configured process the exposed substrate outside of the vacuum chamber to form the photovoltaic module.

In yet another embodiment, there is provided a method for fabricating semiconductor layers of a photovoltaic cell in a vacuum that heats a substrate to a temperature within a predetermined range of temperatures in a vacuum chamber. A first semiconductor material is sublimated at a substantially constant rate from a plurality of holes formed within a first thermal sublimation source block to deposit a first semiconductor layer onto a surface of the substrate. Subsequently, a second semiconductor material is sublimated at a constant rate from a plurality of holes formed within a second thermal sublimation source block to deposit a second semiconductor layer onto the first semiconductor layer. The first and second semi-conductor layers are treated with a halogen-containing substance, and an ohmic contact layer is formed onto the treated first and second semiconductor layers.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 3A and 3B are cross-sectional and overhead views an exemplary vacuum process station for processing a substrate, according to embodiments of the present invention.

FIG. 3C is a cross-sectional view for an exemplary vacuum process station for heated pocket vapor deposition of material onto a substrate, according to embodiments of the present invention.

FIG. 5 is a partial sectional view of the substrate transport apparatus depicted in FIG. 2, according to an embodiment of the present invention.

Figure 6A:
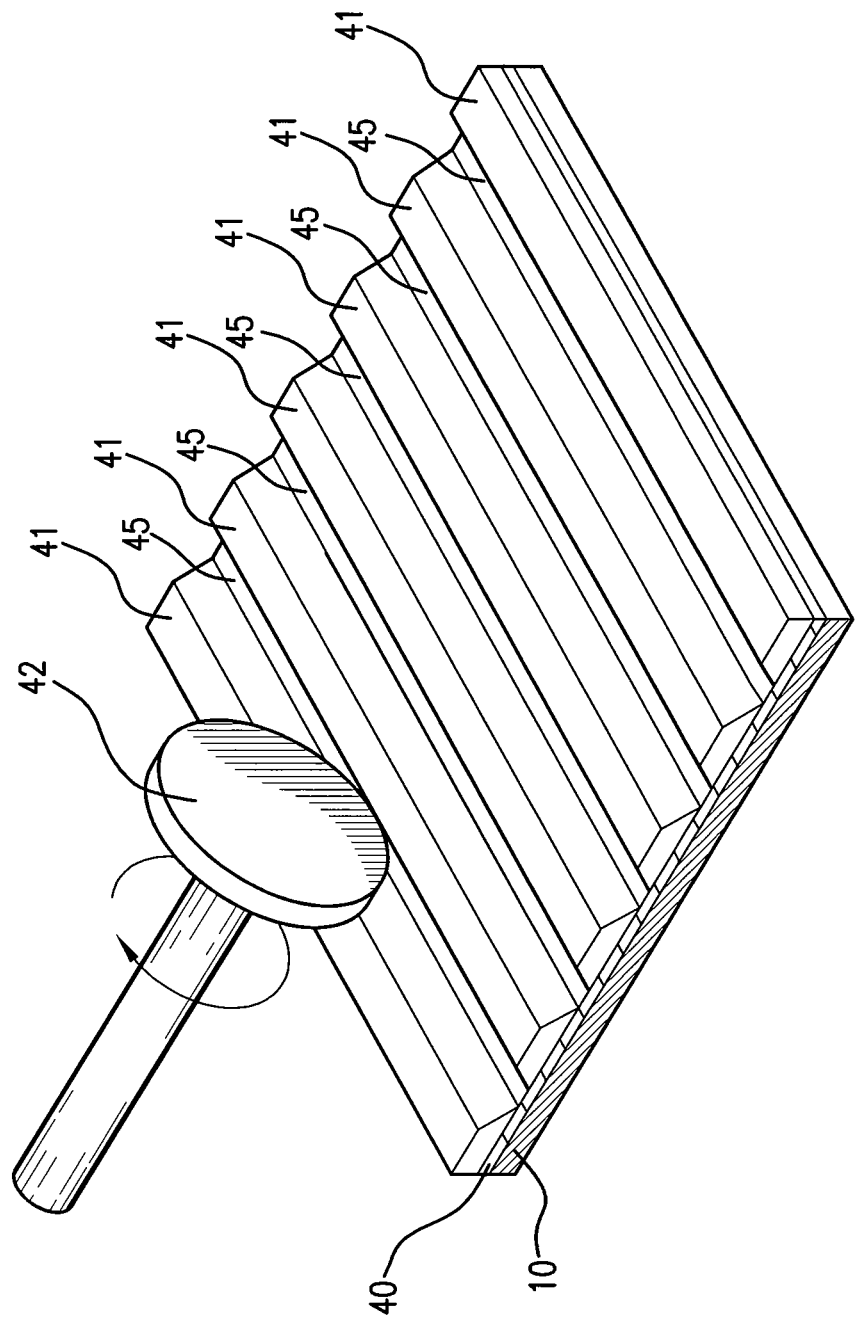
Figure 6B:
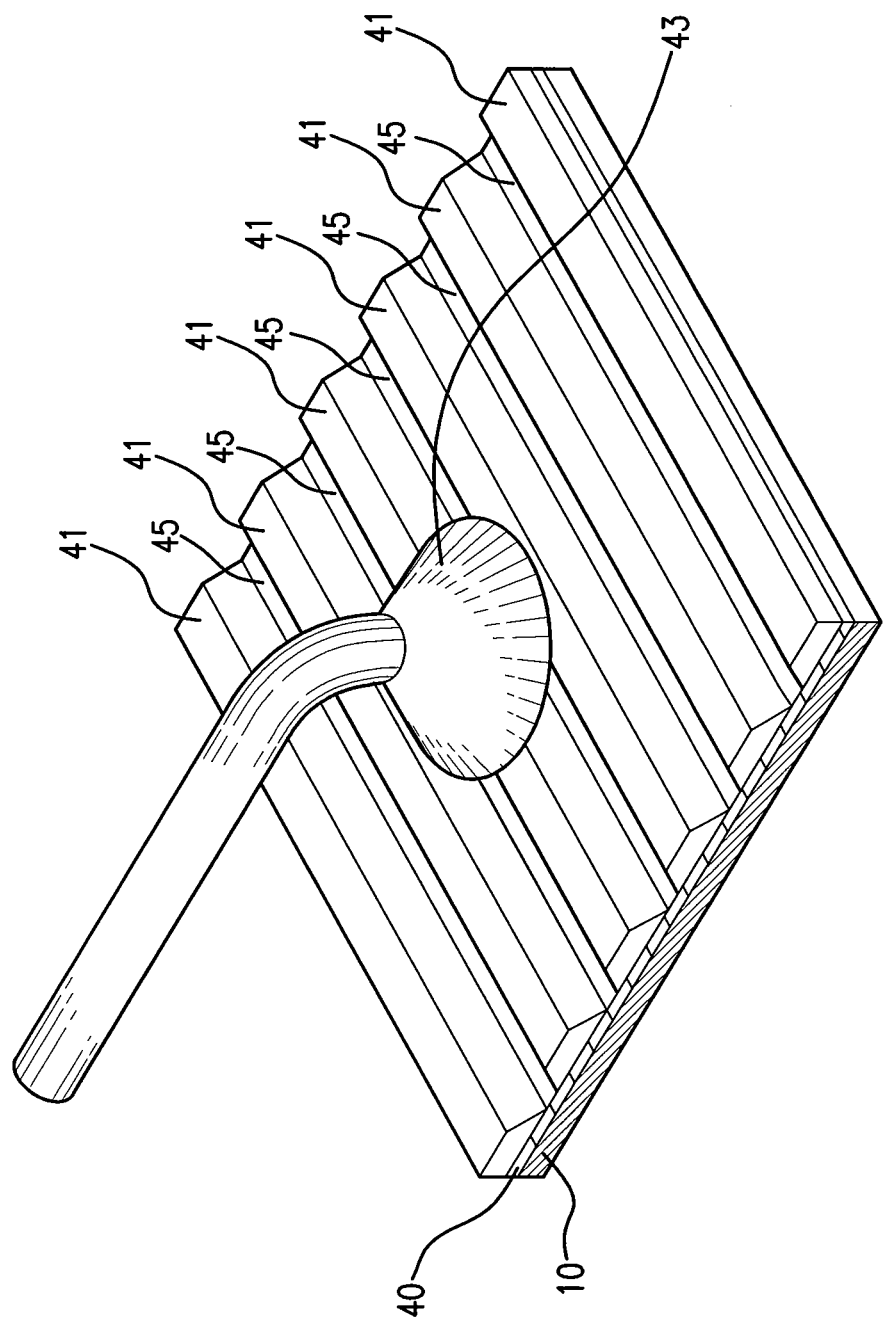

FIGS. 6A and 6B schematically illustrate exemplary processes for scribing substrates, according to embodiments of the present invention.

Figure 7A:
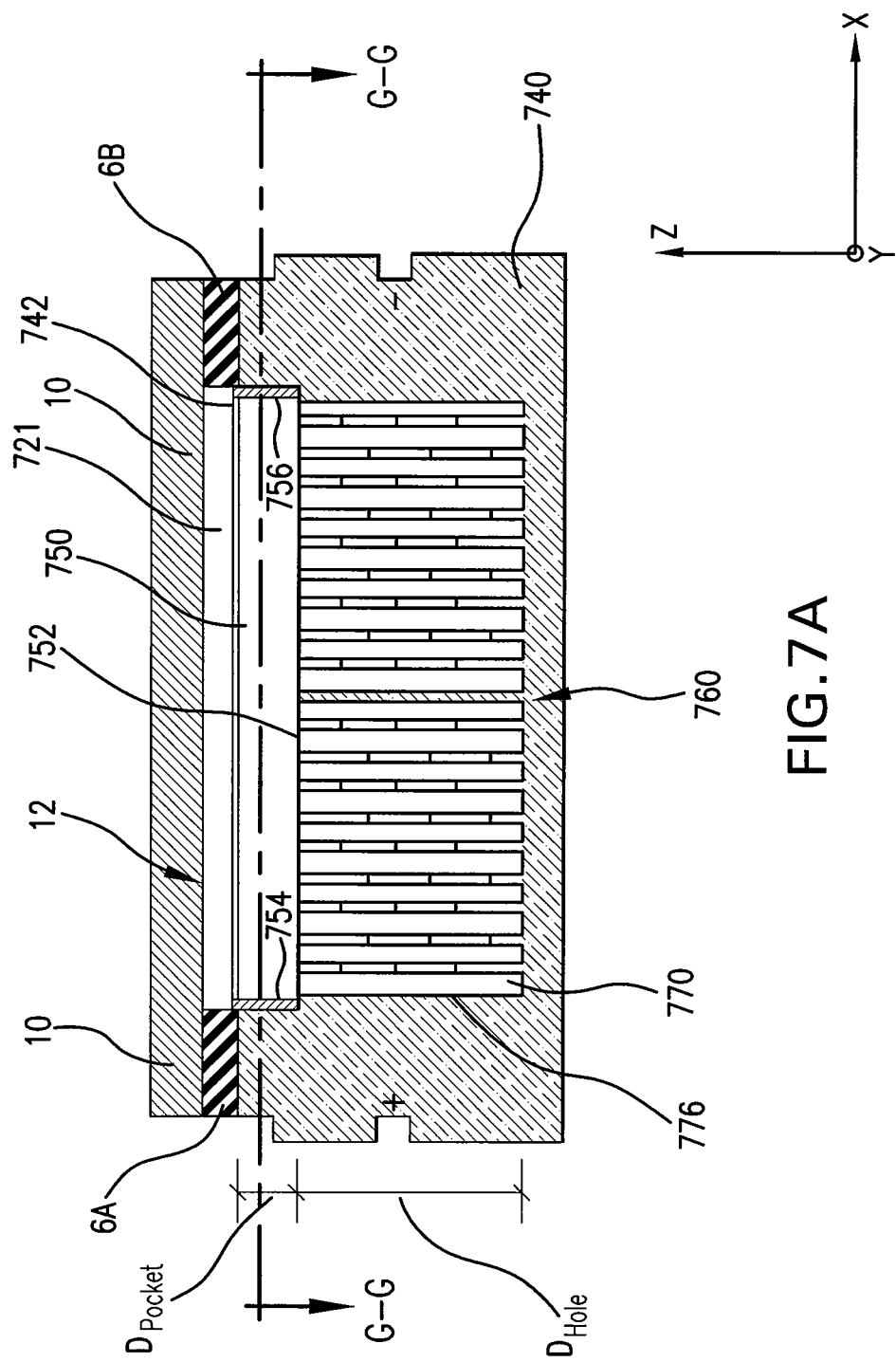

FIGS. 7A and 7B are sectional and overhead views of an exemplary thermal sublimation source block for heated pocket deposition of material onto a substrate, according to an embodiment of the present invention.

Figure 8C:
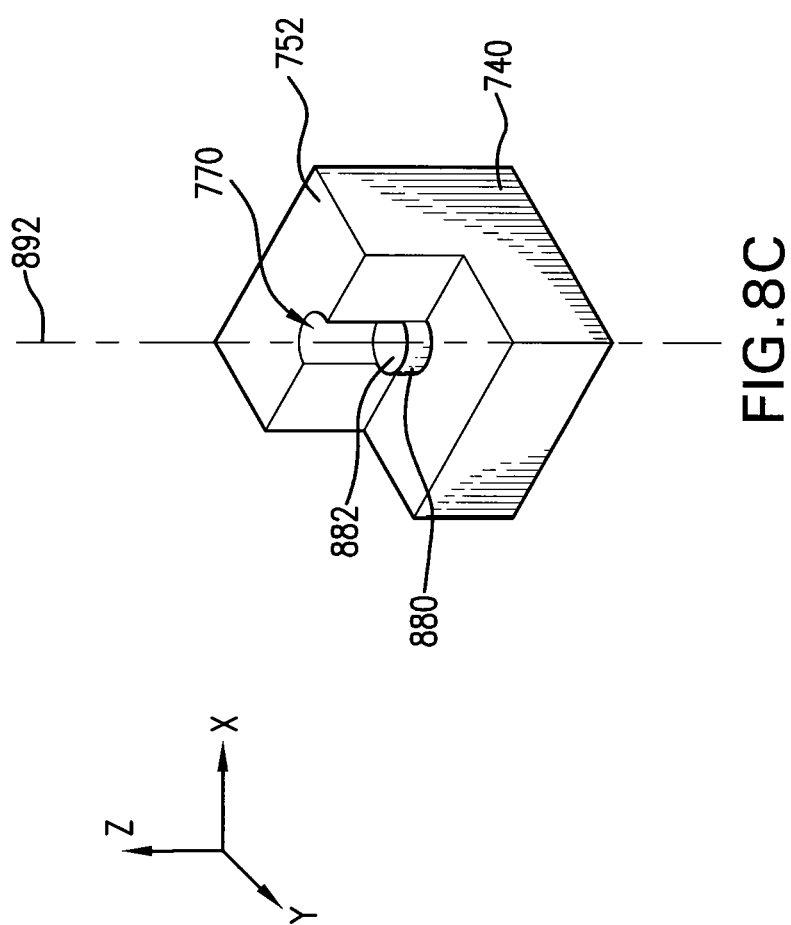

FIGS. 8A, 8B, and 8C depict additional features of the exemplary thermal sublimation source block of FIGS. 7A and 7B, according to an embodiment of the present invention.

Figure 9:
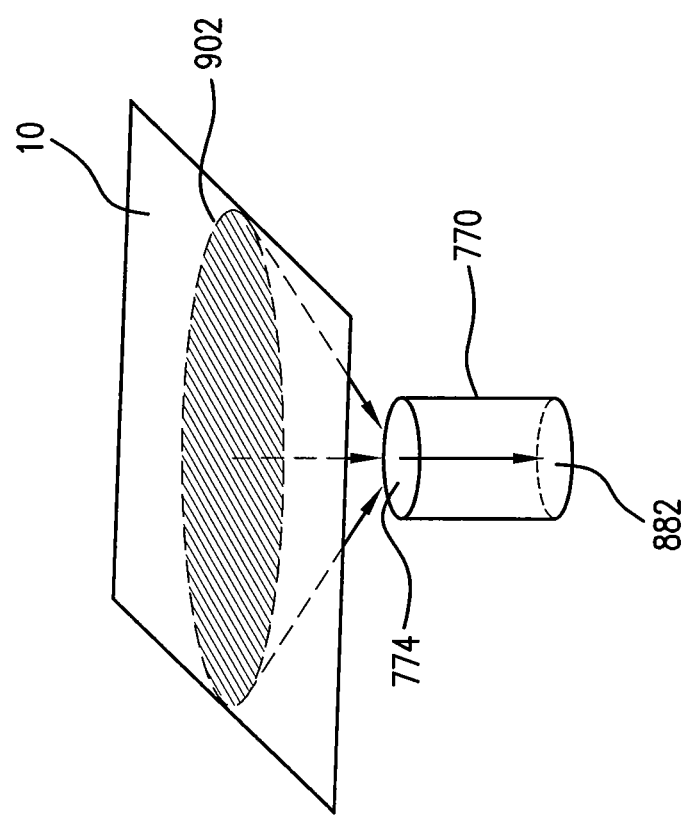

FIG. 9 schematically illustrates radiative heat transfer between a substrate and the exemplary thermal sublimation source block of FIGS. 7A and 7B, according to an embodiment of the present invention.

Figure 10:
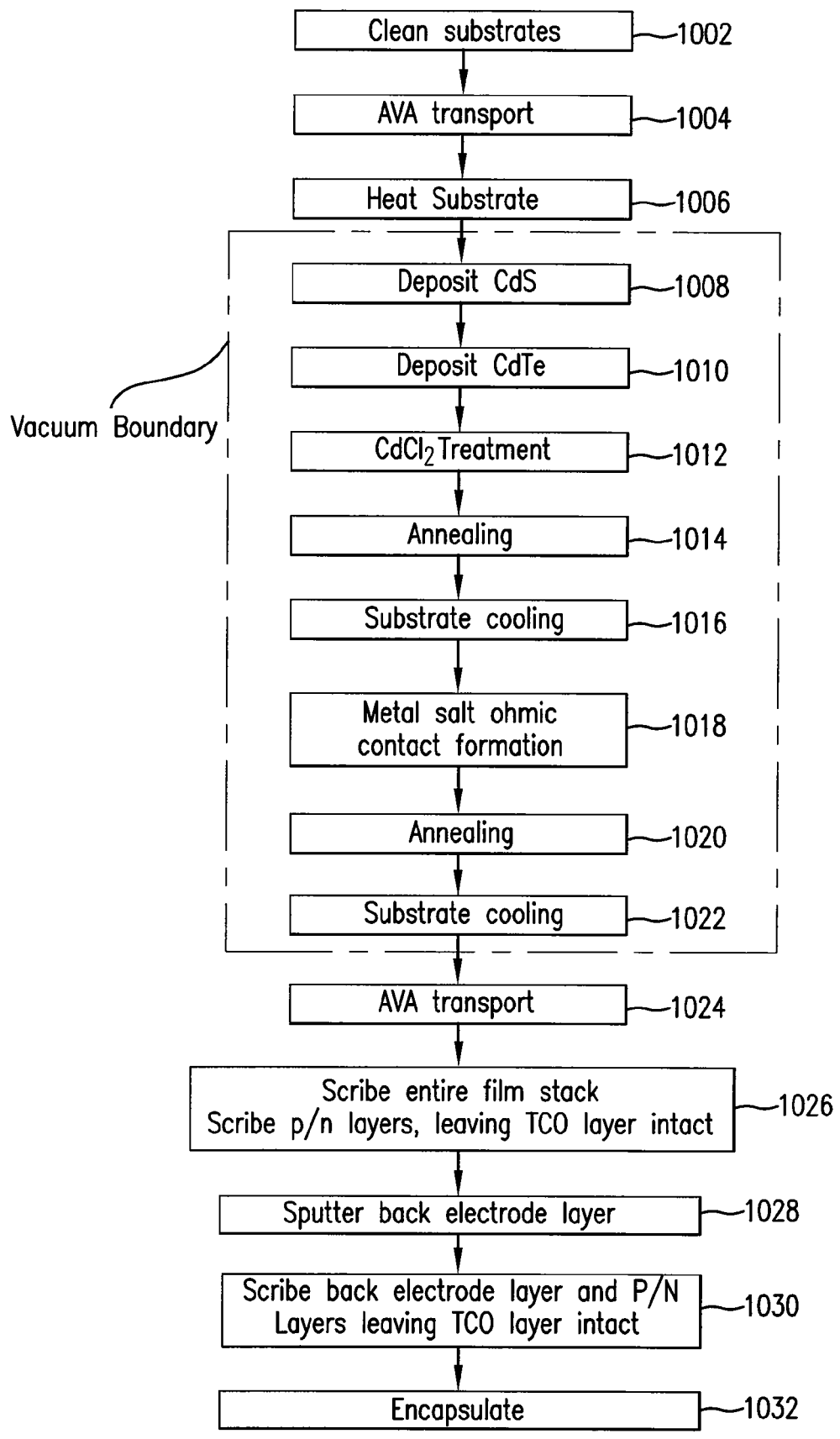

FIG. 10 illustrates an exemplary process for fabricating CdS/CdTe photovoltaic modules, according to an embodiment of the present invention.

One or more embodiments of the present invention will now be described with reference to the accompanying drawings. In the drawings, like reference numbers can indicate identical or functionally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
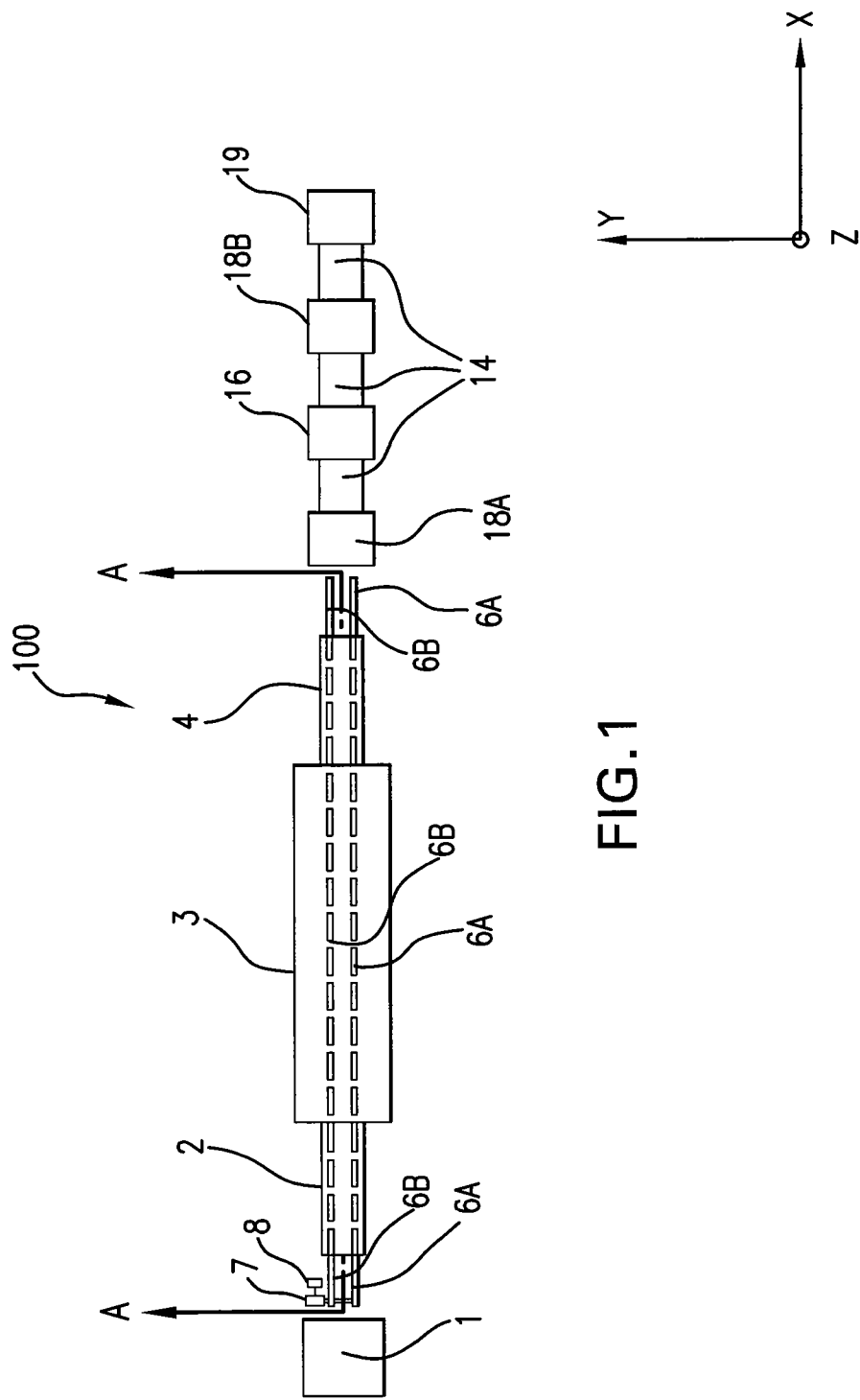
FIG. 1 is an overhead view of an exemplary apparatus for manufacturing photovoltaic modules, according to an embodiment of the present invention.

Exemplary Apparatus for Fabricating CdTe/CdS Photovoltaic Modules Using Heated Pocket Deposition in a Vacuum FIG. 1 is an overhead view of an exemplary apparatus 100 for producing photovoltaic (PV) modules, including, but not limited to, CdS/CdTe photovoltaic modules in a back wall or superstrate configuration, according to an embodiment of the present invention. In the embodiment of FIG. 1, apparatus 100 produces a CdTe/CdS photovoltaic module using a single vacuum chamber 3 having discrete processing stations configured to: (i) heat a substrate; (ii) deposit a CdS layer onto the substrate; (iii) deposit a CdTe layer onto the previously-deposited CdS layer; (iv) heat treat the CDS/CdTe layers with a halogenated vapor or liquid, such as cadmium chloride ($CdCl_2$), and (v) form an ohmic or pseudo-ohmic back contact layer on the treated CdTe layer. A back electrode layer is subsequently applied to the ohmic or pseudo-ohmic layer outside of vacuum chamber 3, after which the resulting PV module is encapsulated.

In the embodiment of FIG. 1, the CdS and CdTe layers are deposited onto the substrate using heated pocket deposition (HPD), a form of physical vapor deposition (PVD) in which a material thermally sublimes from a source block, or carrier, and is deposited onto a substrate. The apparatus includes a series of HPD deposition sources that can deposit a series of films in a film stack on the substrate and also provide heat treatment of the deposited films. The substrates are transported on a pair of metal belts across the series of HPD sources. Each of the sources is generally in the form of a block with a pocket cut into the top surface of the block. n an embodiment, the pocket houses deposition material that sublimes when the block is heated.

In FIG. 1, a substrate cleaning station 1 cleans a substrate prior to processing within vacuum chamber 3. In an embodiment, the substrate may be a commercially-available substrate, including, but not limited to a soda-lime glass substrate coated with a transparent conducting oxide (TCO) coating. However, the present invention is not limited to such substrates, and in additional embodiments, substrate cleaning station 1 may clean any of a number of additional coated or uncoated substrates that would be apparent to one skilled in the art.

After cleaning, a pair of continuous, metal strip belts, shown generally at 6A and 6B, transports the substrate into a first air-to-vacuum-to-air (AVA) opening 2, which facilitates the transport of the substrate from a non-vacuum environment into the vacuum environment of vacuum chamber 3. In an embodiment, metal strip belts 6A and 6B can be moved bi-directionally using a stepper motor 7 controlled by a stepper motor controller 8, thereby providing precise indexing of the position of the belts 6A and 6B.

Once transported into vacuum chamber 3, the substrate is processed by a plurality of vacuum processing stations that, respectively, process a substrate and any associated film stack. For example, the plurality of vacuum processing stations within vacuum chamber 3 may, individually or collectively: (i) heat the substrate; (ii) deposit CdS and CdTe layers onto the substrate, (iii) heat treat the CDS/CdTe layers with a halogen-containing substance; and (iv) form an ohmic or pseudo-ohmic back contact layer on the CdTe layer.

The processed substrate is subsequently transported by metal strip 6A and 6B from vacuum chamber 3 through a second air-to-vacuum-to-air (AVA) opening 4, which facilitates the transport of the substrate from the vacuum environment of vacuum chamber 3 and into the non-vacuum environment. Once transported out of second AVA opening 4, metal strip belts 6A and 6B deposit the processed substrate onto a conveyer belt 14, which subsequently conveys the substrate towards a plurality of additional processing stations that further treat the substrate in the non-vacuum environment.

FIG. 1, conveyer belt 14 initially transports the processed substrate to a first film scribing process station 18A, which processes the substrate and film stack. Once processed by first film scribing process station 18A, the substrate is transported by conveyer belt 14 to a sputtering station 16, and subsequently, to a second film scribing process station 18B. Once processed by a second film scribing process station 18B, conveyer belt 14 transports the substrate to an encapsulation station 19, which encapsulates the PV module.

In an embodiment, additional processing stations 16, 18A, and 18B collectively operate to form a metal back electrode layer adherent to other layers in the film stack and having a relatively low electrical resistance. In such an embodiment, the metal back electrode layer can be fabricated by depositing one or more thin film layers onto the film stack. For example, once the scribing step is completed by first film scribing station 18A, a conductive, metallic coating is applied to the substrate by sputtering station 16. In an embodiment, the conductive metallic coating can include, but is not limited to, a nickel (Ni) coating, a molybdenum (Mo) coating, and any combination thereof with other metals and conductive materials.

In additional embodiments, a metal coating, such as that deposited by sputtering station 16B, may be deposited onto an intervening layer of conductive graphite that, in an embodiment, may be sprayed onto the ohmic contact layer by a spray process station (not shown). In such an embodiment, a dry inert gas, including, but not limited to, nitrogen ($N_2$) and argon (Ar), may be used by the spray process station to limit the inclusion of oxygen and water vapor into the intervening carbon layer.

Once the back electrode layer has been deposited onto the substrate and the resulting scribing processes have been performed, encapsulation station 19 applies a protective back glass and edge encapsulation onto the scribed substrate, thereby providing a level of protection for the completed PV module. In such an embodiment, the back glass forms a glass-glass package with the semiconductor layers in between the glasses and the edges sealed with encapsulant, e.g., a polymer binder. In an embodiment, encapsulation station 19 sprays the encapsulating coating onto the previously-fabricated semiconductor layers at room temperature without harming or introducing defects into the previously fabricated semiconductor layers.

Figure 2:
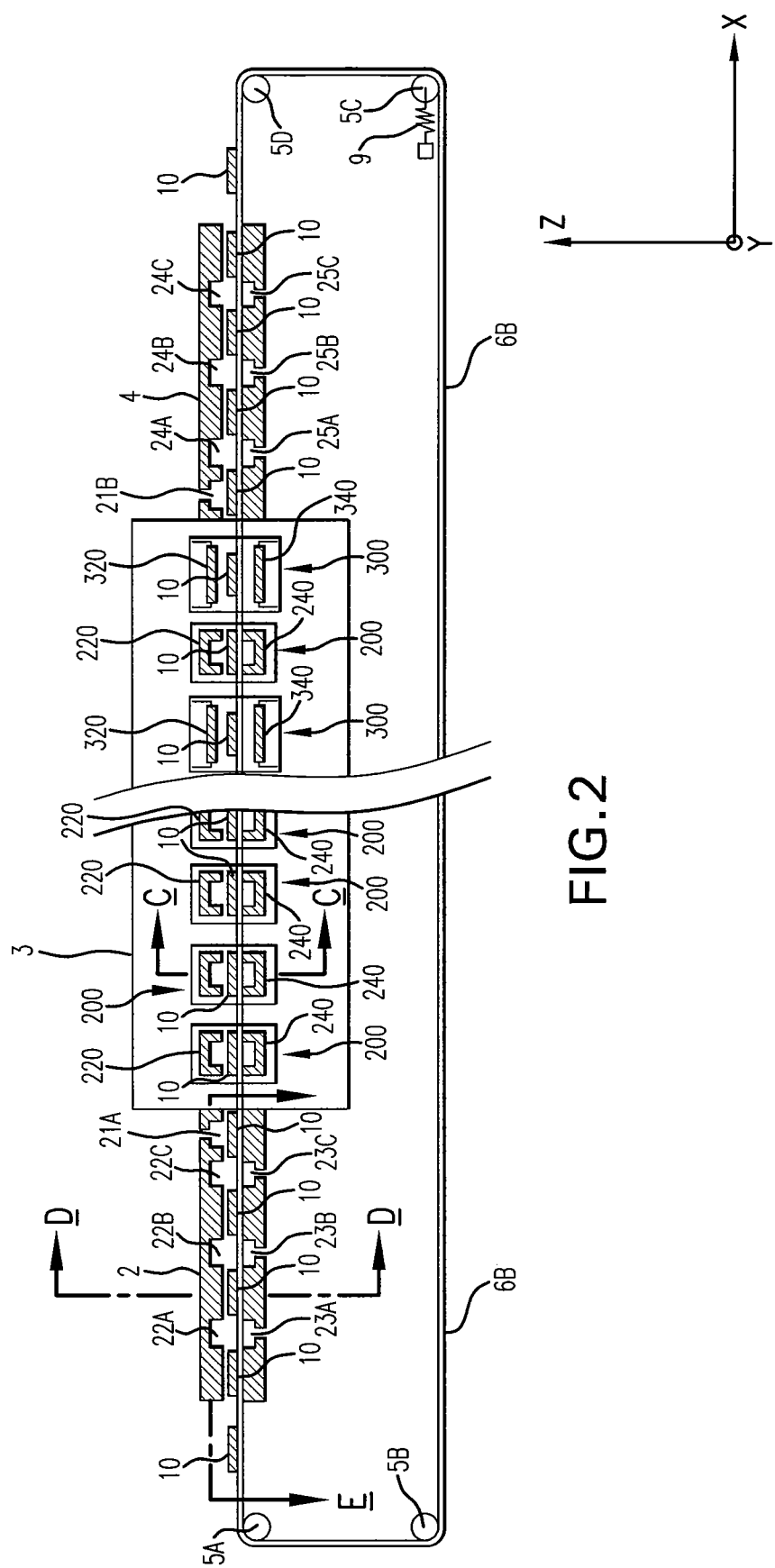
FIG. 2 is a sectional view of a substrate transport system, a vacuum chamber, and vacuum processing stations of the exemplary apparatus of FIG. 1, according to an embodiment of the present invention.

FIG. 2 is a schematic elevation view an exemplary substrate transport system, taken along longitudinal section A-A of FIG. 1, according to an embodiment of the present invention. In FIG. 2, continuous metal belt 6B (and, although not depicted, continuous metal belt 6A) transports a plurality of substrates, shown individually at 10, through first AVA opening 2 into vacuum chamber 3, along a longitudinal length of vacuum chamber 3, and out of vacuum chamber 3 through second AVA opening 4. In an embodiment, vacuum chamber 3 may be pumped down to a desired level of vacuum through any of a number of known techniques, including, but not limited to vacuum pumps. A belt tensioner 9 maintains metal strips 1 at a predetermined tension, and pulleys 5A, 5B, 5C, and 5D continuously move metal belt 6b (and although not depicted, belt 6A) through AVA openings 2 and 4 and through vacuum chamber 3.

In FIG. 2, first AVA opening 2 includes a set of pockets 22A, 22B, and 22C that are, respectively, in fluid communication with a corresponding set of vacuum ports 23A, 23B, and 23C. Similarly, second AVA opening 4 includes a set of pockets 24A, 24B, and 24C that are, respectively, in communication with a corresponding set of vacuum ports 25A, 25B, and 25C. Vacuum ports 23A, 23B, and 23C and vacuum ports 25A, 25B, and 25C are configured, respectively, to pump down first and second AVA openings 2 and 4 to a desired level of vacuum. Further, first AVA opening 2 and second AVA opening 4 respectively include injection ports 21A and 24B that allow an injection of process gas into the respective AVA opening.

Vacuum chamber 3 includes a plurality of individual vacuum processing stations, generally indicated at 200 and 300, and metal strip belts 6A and 6B transport substrates 10 through the plurality of vacuum processing stations 200 and 300. In FIG. 2, each process station 300 respectively includes water-cooled plates 320 and 340 arranged on opposite sides of substrate 10 to facilitate radiative cooling of substrate 10.

Each process station 200 of FIG. 2 includes an upper heated pocket 220 and a lower heated pocket 240. In an embodiment, heated pockets 220 and 240 are configured to provide a flux of heat to a surface of substrates 10, or alternatively, provide a flux of heated vapor to the surface of substrates 10 to deposit a corresponding coating. Heated pockets 220 and 240 can be formed, respectively, from blocks of a material having a relatively low level of impurity, a relatively high thermal conductivity, and a relatively low level of porosity to prevent adsorption of air and water vapor. For example, heated pockets 220 and 240 can be constructed from purified, pyrolitic-grade graphite. However, in additional embodiments, appropriate metals and metals coated with ceramics, as well as other suitable materials apparent to one skilled in the art, may form heated pockets 220 and 240 without departing from the spirit of scope of the present invention.

Although not depicted in FIG. 2, heated pockets 220 and 240 can be heated by one or more lamps suitable for use in high temperatures, including, but not limited to, quartz-halogen lamps. However, in additional embodiments, heated pockets 220 and 240 may be heated using any number of techniques apparent to one skilled in the art, including, but not limited to, resistive heating and inductive heating.

As described above, continuous metal belts 6A and 6B transport substrates 10 through the plurality of process stations 200 or 300 within vacuum chamber 3. In an embodiment, continuous metal belts 6A and 6B can be moved continuously, thereby transporting substrates 10 through process stations 200 and 300 continuously and without pause.

However, in an additional embodiment, stepper motor 7 and controller 8 cooperate to intermittently move continuous metal belts 6A and 6B, and therefore, substrates 10, through process stations 200 and 300 of vacuum chamber 3. In such an embodiment, the intermittent motion of continuous metal belts 6A and 6B includes pauses in the motion of substrates 10 for processing within processing stations 200 and 300 and brief periods of motion to advance substrates 10 to the corresponding next processing step.

For example, individual ones of substrates 10 are placed at equal pitch distances along continuous metal belts 6A and 6B, and the process stations 200 and 300 are placed one pitch distance apart from an adjacent processing station. Continuous metal belts 6A and 6B intermittently drive substrates 10 such that an individual substrate pauses at a corresponding process station 200 and 300 for an equal amount of time. In such an embodiment, a cycle time is defined as a total period of time for one pause and one movement of continuous metal belts 6A and 6B, and an individual substrate within the plurality completes a series of inline vacuum process steps (e.g., processing by corresponding process stations 200 and 300 in the vacuum chamber) for each period of cycle time. In various embodiments, a cycle time can range from about thirty seconds to about two minutes.

Since the process stations 200 or 300 are modular, one or more of a specific type of process station may be placed in series. Further, if a process step were to require a processing time in excess of the cycle time, then that process step may be performed over a series of corresponding processing stations 200 or 300. For example, an annealing step, which requires a longer period of time to complete than the cycle time, may be carried out over a series of annealing process stations 200.

In particular, the intermittent motion of continuous metal belts 6A and 6B provides a pause during which a thin film material is deposited onto a surface of one or more substrates by one or more corresponding process stations 200. During such a pause, as depicted in FIG. 2, individual substrates 10, which are spaced at regular pitch intervals on continuous metal belts 6A and 6B, are respectively in a sealing relationship with a corresponding pair of heated pockets 220 and 240. Further, during such a pause, heated pockets 220 and 240 of the corresponding process station 200 can deposit a film (e.g., a CdTe or a CdS film) onto a surface of the substrate.

FIG. 3A is a sectional view of an exemplary vacuum process station 200 along section C-C of FIG. 2, according to an embodiment of the invention. In FIG. 3A, process station 200 includes an upper block 220 having pocket 230 and a lower block 240 having pocket 250, thereby forming pair of heated pockets described above in FIG. 2.

As described above, upper block 220 and lower block 240 can be formed from blocks of pyrolitic-grade graphite, metals, metals coated with ceramics, or any additional material of suitable thermal conductivity, porosity, and purity that would be apparent to one skilled in the art. Further, pockets 230 and 250 may be formed in respective upper block 220 and lower block 240 through mechanical milling or cutting, chemical etching, sputtering, or through any additional technique appropriate to the block material without departing from the spirit or scope of the present invention.

Upper block 220 and lower block 240 can, respectively, be heated by electrical heat sources 202 and 204 that are suitable for use in a high-temperature vacuum environment, such as, but not limited to, quartz halogen lamps. Heat sources 202 and 204 are respectively housed within enclosures 206 and 208, which physically isolate heat sources 202 and 204 and which support both lamps 202 and 204 and upper and lower heated blocks 220 and 240. Enclosures 206 and 208 also electrically isolate heat sources 202 and 204 and act radiation shields to reduce the loss of energy.

As depicted in FIG. 3A, continuous metal belts 6A and 6B position a substrate 10 over lower block 240 and therefore, over pocket 250 of lower block 240. As such, a clearance distance 210 is established between a lower surface 12 of substrate 10 and an upper surface of lower block (denoted by dashed line 242). In an embodiment, clearance distance 210 ranges from approximately 0.001 inches to approximately 0.018 inches, and clearance distance 210 can be defined by a thickness of continuous metal belts 6A and 6B.

Figure 3B:
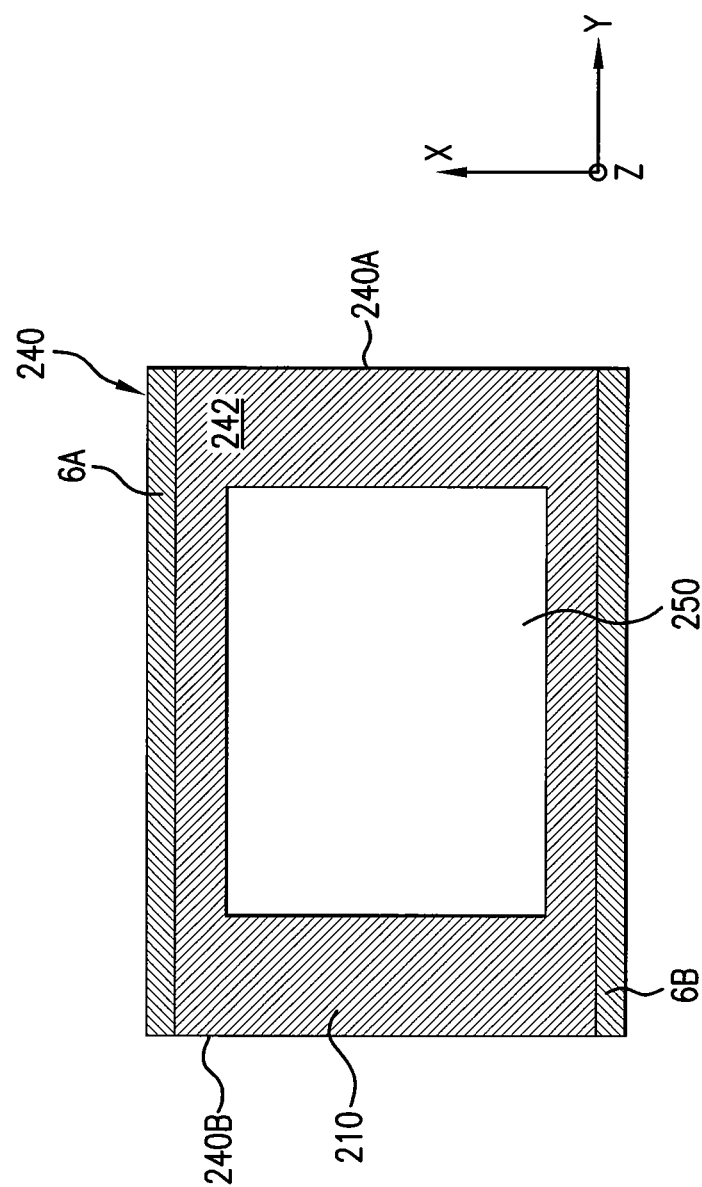

FIG. 3B is an overhead sectional view of exemplary lower heated block 240 of FIG. 3B, taken along section E-E of FIG. 3A. In FIG. 3B, clearance distance 210 exists across a portion upper surface 242 of lower heated block 240 bounded by continuous metal belts 6A and 6B and not consumed by pocket 250. As such, a void of depth equivalent to clearance distance 210 between surface 242 and substrate 10 (not shown) exposes pocket 250 to the vacuum environment surrounding lower heated block 240 along first edge 240A and second edge 240B.

In an embodiment, process stations 200, as depicted in FIG. 2, can perform a variety of processes on substrates 10. For example, processing stations can (i) rapidly heating a substrate, (ii) anneal a substrate and films, (iii) thermally strip a film from a substrate, (iv) expose a substrate and corresponding film to a vapor treatment, and (v) deposit a thin film on a substrate. In an embodiment, a number of parameters may dictate which particular process is performed by processing station 200, including, but not limited to (a) a temperature of a lower block 240, (b) a temperature of an upper block 220, and (c) a presence or absence of deposition material within pocket 250 of lower block 240. Processes (i) through (v), are robust, are occupationally and environmentally safe, and may be performed by process stations 200 of apparatus 100 at relatively high throughput and at relatively low capital cost.

For processes (i), (ii), and (iii) described above, no deposition material is loaded into pocket 250 of lower block 240, as depicted in FIG. 3A. In process (i), both upper and lower blocks 220 and 240 are maintained at temperatures such that substrate 10 can be heated in a short cycle time, for example, a cycle time of approximately one minute. In such an embodiment, the uniformity of heating prevents cracking of the substrates 10. For process (ii), upper and lower blocks 220 and 240 and substrate 10 are maintained at a temperature insufficient to resublime previously-deposited thin films from a surface of substrate 10. For process (iii), upper and lower blocks 220 and 240 and substrate 10 are maintained at a temperature that is high enough to cause films on the substrate 10 to sublime away from a surface of substrate 10.

For processes (iv) and (v), as described above, deposition material (e.g., CdTe, CdS, an additional thin-film material, solid $CdCl_2$, metal salts, etc.) is loaded into pocket 250 of lower block 240, as depicted in FIG. 3C. FIG. 3C is a sectional view of an exemplary vacuum processing station for heated pocket deposition of material onto a substrate, taken along section C-C of FIG. 2, according to an embodiment of the present invention.

In contrast to FIG. 3A, a solid deposition material 35, including, but not limited to solid CdTe, solid CdS, combinations thereof, solid halogenated compounds, solid metal salts, or other materials, is disposed along a lower surface 252 of pocket 250, which is substantially parallel to both upper surface 242 of block 240 and to lower surface 12 of substrate 10. In an embodiment, deposition material 35 may be separated into discrete portions regularly spaced along lower surface 252. As such, in FIG. 3B, lower block 240 serves as a thermal sublimation source block for deposition material 35.

In process (iv), upper block 220 and substrate 10 are maintained at a higher temperature than source block 240. In such an embodiment, the deposition material 35 sublimes in source block 240, thereby exposing lower surface 12 of substrate 10 to sublimated vapor. However, due to the temperature of substrate 10, the sublimated material is not deposited as a film onto substrate 10. For example, process (iv) can be employed to expose a previously-deposited stack of CdS and CdTe thin films to a cadmium chloride ($CdCl_2$) vapor sublimed from source block 240.

In contrast, for process (v), source block 240 is maintained at a higher temperature than both substrate 10 and upper block 220. As described above, the deposition material sublimes within pocket 250 of source block 240. However, unlike process (iv), the temperature difference between substrate 10 and source block 240 allows the sublimed vapor to condense and be deposited as a film on lower surface 12 of substrate 10. For example, process (v) can be employed to deposit thin films of CdTe, CdS, other appropriate thin film material, or metal salt onto a soda-lime glass substrate having a TCO coating.

As described above, continuous metal strip belts 6A and 6B may intermittently move substrates, such as substrate 10, within vacuum chamber 3 and between processing stations 200 and 300. As such, substrates 10 will pause at processing stations to for a specific pause time, and for a given pause time, a thickness of a film deposited by processing station 200 of FIG. 3B can be varied by varying the respective temperatures of upper block 220 and source block 240. For example, a closed-loop control of film thickness can be obtained by measuring film thickness with a thickness monitor and subsequently adjusting a temperature of one or more of upper block 220 and source block 240. Such a closed look control process can, in an embodiment, achieve precise control of film thickness, as the deposition rate of thin-film material is a function of the temperature of both upper block 220 and source block 240.

As described above in reference to FIG. 3A, clearance distance 210 between lower surface 12 of substrate 10 and upper surface 242 of source block 240 is ranges from approximately 0.001 inches to approximately 0.018 inches. In FIG. 3B, clearance distance 210 prevents lower surface 12 of substrate 10 from directly contacting any portion of source block 240, thereby substantially reducing or eliminating any contact-related damage to the deposited film. Further, parasitic deposition of this film material onto surfaces of continuous metal belts 6A and 6B is substantially reduced or eliminated by supporting continuous metal belts 6A and 6B with sidewalls 241A and 241B of source block 240.

As described above in reference to FIG. 3B, a void having a depth equivalent to clearance distance 210 exposes the vacuum environment to the sublimed material along edges 240A and 240B of source block 240. However, surfaces of pocket 250, such as surfaces 254 and 256, respectively collimate the vapor flux from sublimed deposition material 35. Since the void along edges 240A and 240B is substantially perpendicular to the collimated vapor flux, nearly all of the vapor flux will pass clearance distance 210 without directly entering the void. Any vapor that does enter the void due to gas scattering will be readily deposited on the surface of the substrate 10 without escaping to the vacuum environment along edges 240A and 240B.

Further, clearance distance 210 also provides a close tolerance slip fit seal between upper surface 242 of source block 240 and lower surface 12 of substrate 10. As such, viscous effects are negligible through the void region having depth equivalent to clearance distance 210, thereby substantially limiting vapor leaks through the void region. In such an embodiment, substrate 10 acts as a shutter across the lower source pocket 250 that substantially eliminates cross contamination between adjacent processing stations, such as process stations 200 of FIG. 2. By eliminating cross contamination, a single vacuum boundary may be used for the multiple processing steps, thereby reducing the capital cost of the system (in many existing vacuum processes for manufacturing PV devices, load locks or load locks in combination with intermediate chambers are used to prevent cross contamination between processing steps).

In FIG. 3C, deposition material 35 is distributed in an evenly spaced pattern across lower surface 252 of pocket 250. In various embodiments, deposition material 35 may be in the form of powder, pellets pressed from powder, random chunks, or additional commercially-available or derivable forms of deposition material apparent to one skilled in the art and appropriate for PV construction. Also, the distance between the deposition material 35, disposed along lower surface 252, and lower surface 12 of substrate 10 (e.g., the depth of pocket 250) is sufficient to allow for gas scattering of the sublimed species.

Gas scattering results from of collisions between molecules of the sublimed material, and additionally, between the sublimed species and the molecules of the ambient gas. These collisions deflect and scatter the sublimed species from away from a straight-line path as molecules of the sublimed species traverse the distance between deposition material 35 to the substrate 10. Such scattering is generally advantageous to the PVD process, since the scattering of sublimed species results in a uniform deposition of sublimed material onto substrate 10.

A characterization of the gas scattering occurring in the PVD process can be based on the Knudsen number (Kn), which is a dimensionless parameter or length scale. Knudsen number is defined as a ratio of a mean free path of gases within pocket 250, at a given temperature and pressure, to a distance between the deposition material 35 and the substrate 10. If the Knudsen number is less than about 0.01, then gases within pocket 250 are within a viscous flow regime and gas-scattering effects will non-negligible. However, within such a viscous flow regime, collisions between molecules of sublimed species (and collisions between such species and ambient gas molecules) may decrease an energy level the molecules of sublimed gas (e.g. thermalize the molecules), thereby fostering condensation of these sublimed species into nano-particles that decrease the effectiveness of the deposition process.

For Knudsen numbers greater than unity, gases within pocket 250 experience a molecular flow regime in which viscous effects are negligible and in which minimal gas scattering occurs. In such a flow regime, molecules of sublimed material travel in relatively straight lines from the point of sublimation to the substrate, and this line-of-sight deposition, or beaming, can result in a non-uniform film thickness across lower surface 12 of substrate 10.

For Knudsen numbers between 0.01 and unity, molecules of sublimed material experience a transitional regime with non-negligible gas scattering. In the transitional regime, the vapor flux is randomized by gas scattering. However, the number of collisions are relatively few, and as such, the sublimed species retain most of their energy and therefore, do not condense into nano-particles before striking lower surface 12 of substrate 10. In an embodiment, process station 200 of FIG. 3C deposits thin-film materials onto lower surface 12 of substrate 10 through sublimation within the transitional regime having Knudsen number ranging from about 0.07 to about 0.44. As such, the deposition process, as outlined above in reference to process (v), results in a substantially uniform film thickness across lower surface 12 of substrate 10.

Further, in the embodiment of FIG. 3C, sublimed vapor within pocket 250 is heated to a uniform, high temperature, as substrate 10 acts as a shutter for source block 240. Such a uniform, high temperature of the process gas also discourages molecular coalescence during gas scattering, and therefore, reduces the formation of nano-particles of sublimed material.

Figure 4A:
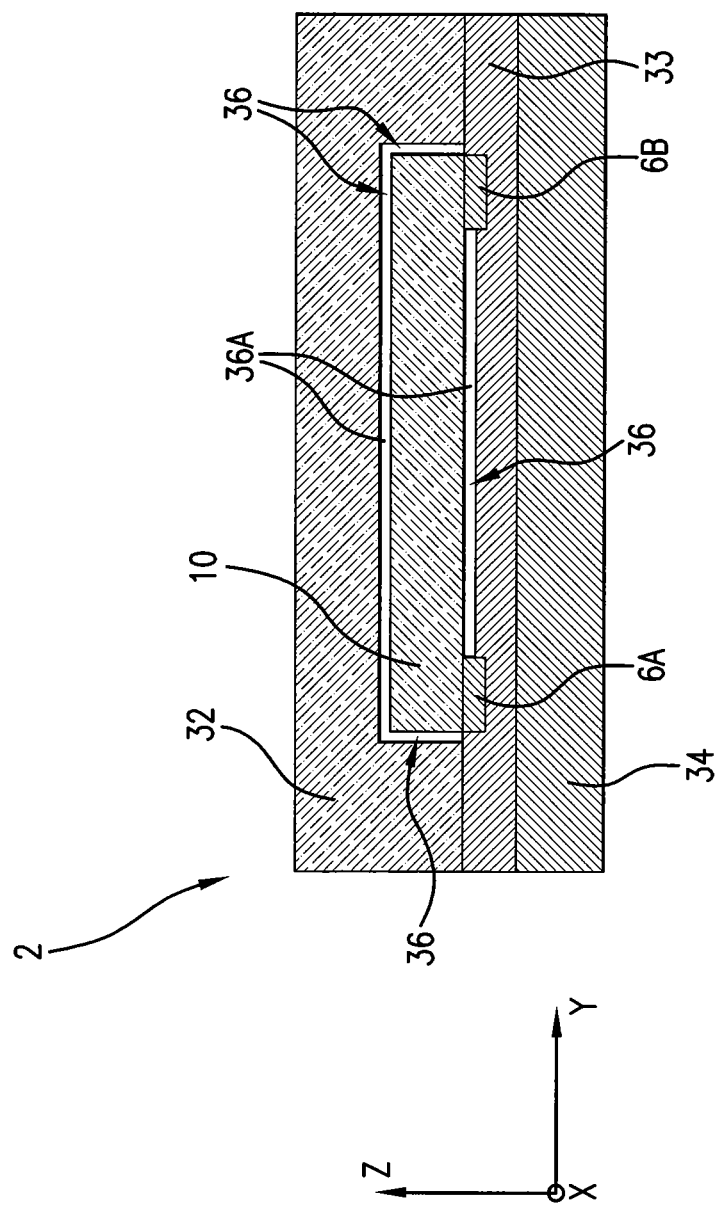
FIGS. 4A and 4B are cross-sectional and overhead views of an exemplary air-to-vacuum-to-air opening that may be incorporated into the substrate transport system of FIG. 1, according to an embodiment of the present invention.

FIG. 4A is a sectional view of an exemplary air-to-vacuum-to-air (AVA) opening, taken along transverse section D-D of FIG. 2, according to an embodiment of the present invention. In FIG. 4A, an AVA opening 2 includes a top channel 32 and a bottom plate 34 that are, respectively, separated by a belt bearing plate 33, thereby forming an opening 36 through which a substrate 10 passes into a vacuum chamber (not shown). Further, continuous metal strip belts 6A and 6B act as a substrate carrier to convey substrate 10 through opening 436 and into the vacuum chamber.

In FIG. 4A, top channel 32 and belt bearing plate 33 are positioned such that a clearance distance 36A of approximately 0.005 inches±about 0.002 inches is formed between a surface of top channel 32, a surface of belt bearing plate 33, and a surface of substrate 10. In an embodiment, clearance distance 36A is large enough to allow substrate 10 to move freely through opening 36, but small enough to generate resistance to fluid flow through the clearance distance 36A, thereby allowing vacuum chamber 3 to be maintained at a desired vacuum level.

Figure 4B:
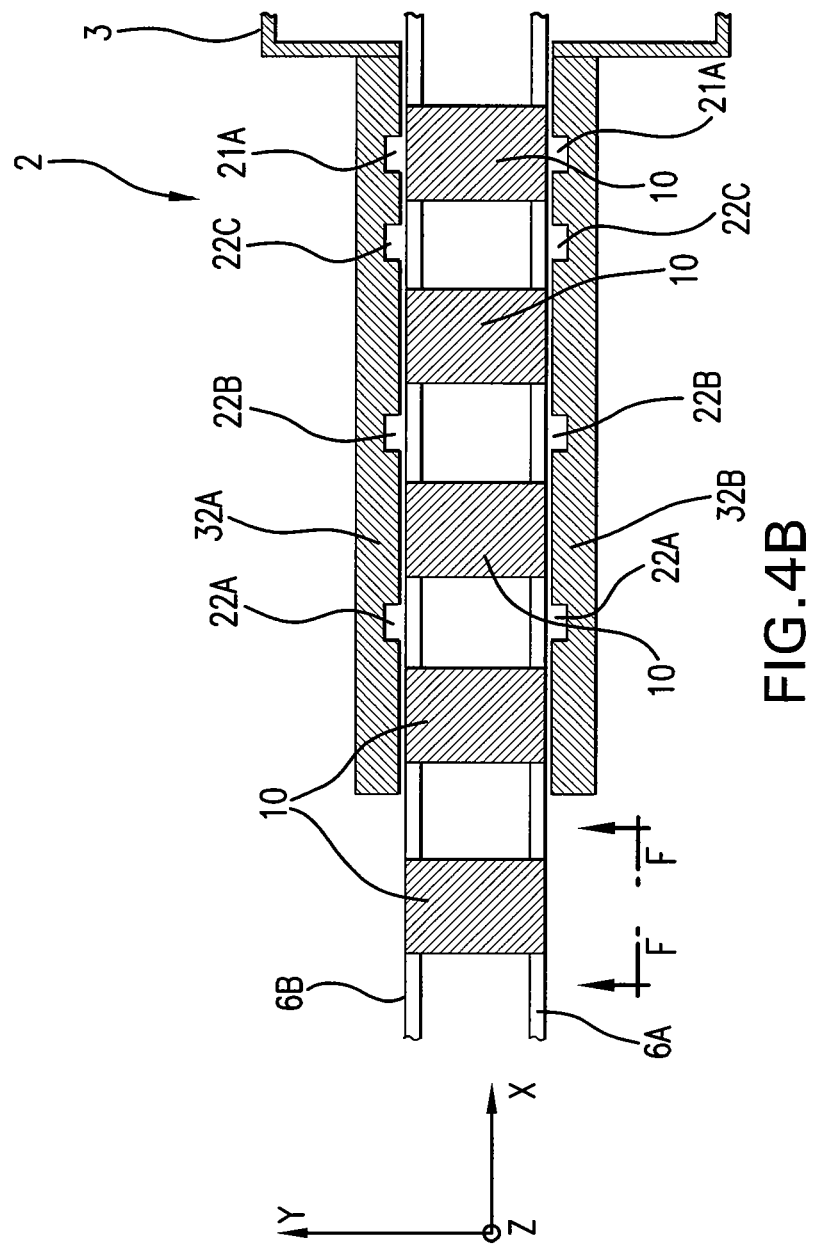

FIG. 4B is a partial overhead view of an exemplary AVA opening, taken along longitudinal section E-E of FIG. 2, according to an embodiment of the present invention. In FIG. 4B, continuous metal 6A and 6B belts transport a plurality of substrates 10 through AVA opening 2 and into vacuum chamber 3. As described above in FIG. 4A, sidewalls 32A and 32B of top channel 32 respectively include pockets 22A, 22B, and 22C, which, in the embodiment of FIG. 4B, are disposed at regular intervals along respective sidewalls 32A and 32B (although not depicted in FIG. 4C, respective ports 22A, 22B, and 22C are in fluid communication with a corresponding vacuum port, as depicted in FIG. 2, for exhausting contents AVA opening 2 to vacuum). Further, respective sidewalls 32A and 32B include a corresponding injection port 21A for injecting process gases into AVA opening 2.

Exemplary AVA opening 2, as depicted in FIGS. 4A and 4B, facilitates a rapid transport of substrates 10 from air into the vacuum environment of vacuum chamber 3. However, in additional embodiments, the features AVA opening 2 depicted in FIGS. 4A and 4B may also facilitate a rapid transport of substrates 10 from the vacuum environment of vacuum chamber 3 back to air. As such, the features of exemplary AVA opening 3A are applicable to both first AVA opening 2 of FIG. 2, which transports substrates from air to vacuum, and to second AVA opening 4, which transports substrates from vacuum to air.

FIG. 5 is plan view of a portion of an exemplary substrate transport system, taken along section F-F of FIG. 4B, according to an embodiment of the present invention. A substrate 10 is positioned on a pair of continuous metal belts 6A and 6B, although in the plan view of FIG. 5, only belt 6A is visible. Substrate 10 is secured to continuous metal belt 6A using tabs 10A and 10B, which can prevent longitudinal movement or slipping of substrate 10 along belt 6A. Although not depicted in FIG. 5, a similar set of tabs may secure substrate 10 to continuous metal belt 6B, and further, each substrate transported through AVA openings 2 and 4 and through vacuum chamber 3 of FIG. 2 can be secured onto continuous metal belts 6A and 6B using a similarly-disposed set of tabs. In an embodiment, tabs 10A and 10B can be welded onto belt 6A, although in additional embodiments, tabs 10A and 10B may be attached to continuous metal belts 6A using any of a number of suitable techniques, as would be apparent to one skilled in the art.

In an embodiment, continuous metal strip belts 6A and 6B are formed of metal alloys that have high resistance to corrosion and that retain high strength at elevated temperatures. Additionally, continuous metal belts 6A and 6B may be coated with various materials, including, but not limited to ceramic materials or polymers, that alter the surface properties of continuous metal belts 6A and 6B.

FIGS. 6A and 6B illustrate exemplary scribing processes performed by a film scribing station, according to an embodiment of the present invention. In FIG. 6A, a rotating wire brush 42 is brought into contact with substrate 10 through openings 45 in a mask 41 to remove portions of a deposited film 40 from substrate 10 (e.g., a graphite coating applied to an ohmic contact layer by first spray process station 16A or a metallic coating applied by second spray process station 16B). Openings 45 in mask 41 can be tapered in cross section and are narrower near the contact of mask 41 and film layers 40, thereby facilitating entry of rotating brush 42 into openings 45. In an embodiment, mask 41 can be coated with a hard coating, including, but not limited to, titanium nitride, to reduce wear.

In embodiment, the exemplary scribing process of FIG. 6A does not require a precisely-defined rotating brush 42, as openings 45 in the mask 41 define an area of film 40 that will be removed. In such a case, rotating wire brush 42 is passed axially along the openings 45 in the mask 41 over the substrate 10 to perform a scribe. In an additional embodiment, a plurality of rotating metal brushes 42 may scribe substrate 10 in a single process.

In FIG. 6B, an abrasive blast 43 passes through openings 45 in mask 41 to remove portions of the film 40 from the substrate 10. Similar to the embodiment of FIG. 6A, a precisely-defined abrasive blast 43 is not required, as mask 41 defines an area of the film 40 that will be removed. Abrasive blast 43 passes over substrate 10 to perform a scribe, and a respective abrasive blast may enter more than one opening 45 in mask 41. As such, a single abrasive blast 43 may perform more than one scribe for each pass over the substrate 10. In an additional embodiment, a plurality of abrasive blasts 43 may complete a corresponding plurality of scribes of a single substrate in a single pass along the axis of openings 45 in mask 41.

Further, abrasive media of various hardness and size may selectively scribe various layers in the film stack 40. As such, the exemplary scribing process of FIG. 6B may (i) scribe through the film stack and the relatively-hard TCO layer or (ii) selectively scribe through each film layers above the TCO layer without removing the TCO. In an additional embodiment, the abrasive powder scribing of FIB. 6B may be used in conjunction with rotating brush 42 to scribe a TCO layer of a substrate, as rotating brush 42 alone cannot remove the relatively hard TCO layer.

Exemplary Thermal Sublimation Source Blocks for Heated Pocket Deposition of Thin Films in a Vacuum As described above, physical vapor deposition techniques, especially vacuum sublimation deposition of CdTe and CdS thin films, are especially amenable to the commodity manufacturing of CdTe/CdS PV modules. In particular, heated pocket deposition (HPD) techniques in which a deposition material sublimes from within a pocket of a thermal sublimation source block, such as source block 240 of FIG. 3C, are capable of depositing CdS and CdTe thin films onto substrates at rates ten to one hundred times higher than other suitable deposition method in modest levels of vacuum. However, over extended period of operation, the HPD apparatus described above, and in particular, the sublimation of deposition material 35 arranged about lower surface 252 of pocket 250 in FIG. 3C, can experience non-uniform thin-film deposition rates and transients within a deposition vapor flux.

For example, in FIG. 3C, deposition material 35 is distributed in a regular pattern about lower surface 252 of pocket 250 in source block 240. Further, during deposition processes, substrate 10 is positioned over pocket 250 and serves as a shutter for pocket 250, as described above. However, during some processing steps, a temperature of substrate 10 in FIG. 3C may exceed a corresponding temperature of source block 240, and as such, undesired radiative heat transfer may occur between the relatively-hot substrate 10 and the relatively-cool deposition material 35.

A rate of thermal radiation heat transfer between a first body, such as relatively-hot substrate 10, and a second body, such as relatively-cool deposition material 35, can be characterized simply as:

$$Q = AF_{1 \to 2} \sigma (T_1^4 - T_2^4), \quad (1)$$

where:
Q is a rate of radiative heat transfer between the first and second bodies;
A is an area of the first body;
$F_{1 \to 2}$ is a radiation shape between the first and second bodies;
σ is Boltzmann's constant; and
$T_1$, $T_2$ are the respective temperatures of the first and second bodies.

The radiation shape factor, $F_{1 \to 2}$, for the radiative transfer from the first body to the second body ranges from zero to unity and describes a fraction of radiation that is emitted from the first body and subsequently received by the second body. As such, the radiation shape factor characterizes a "view" held by the first body of the second body.

Referring back to FIG. 3C, a radiation shape factor between substrate 10 and deposition material 35 is nearly unity, since substrate 10 covers pocket 250 during deposition, and since deposition material 35 is arranged about lower pocket surface 252 of pocket 29B that is substantially parallel to lower surface 12 of substrate 10. Therefore, lower surface 12 of substrate 10 has a nearly unrestricted "view" of deposition material 35. As such, during those processes in which a temperature of substrate 10 is higher than a temperature of deposition material 35, radiative heat transfer from substrate 10 to deposition material 35 can increase a temperature of deposition material 35. Such increases in deposition material temperature can increase a sublimation rate of deposition material 35 and generate transients in the deposition vapor flux incident on substrate 10.

Further, a radiation shape factor between lower block 240 and deposition material 35 varies across lower pocket surface 252 of pocket 250. For example, a radiation shape factor for deposition material located near a corner of pocket 250, which receives thermal radiation from two walls of pocket 250, may be significantly larger than a corresponding shape factor for deposition material located near a center of pocket 250. Therefore, a radiative heat flux incident on deposition material located near a corner of pocket 250 can be substantially larger than a corresponding radiative heat flux incident on deposition material near the center of pocket 250, leading to a higher temperature for deposition materials located in the corner. As such, deposition material located in corners of pocket 250 may sublimate at a substantially higher rate than deposition material located near the center of pocket 250, leading to both non-uniform deposition on substrate 10 and a non-uniform sublimation surface area across lower pocket surface 252 after long deposition periods.

As described above, variations in radiative heat transfer across lower pocket surface 252 of FIG. 3C can lead to non-uniformities in the sublimation surface area of deposition material 35 that is arranged on lower pocket surface 252. These variations in sublimation surface area can also result in a corresponding variation in a sublimation rate of the deposition material arranged on lower pocket surface 252. A rate of sublimation of molecules from a surface can be defined according to the Hertz-Knudsen equation:

$$\frac{dN_S}{dt} = \frac{A_S \alpha_V (p_{equilibrium} - p)}{\sqrt{2\pi mkT}}, \quad (2)$$

where:

$\frac{dN_S}{dt}$ is a number of molecules sublimed from a surface per unit time;
$A_S$ is a sublimation surface area of the surface;
$\alpha_V$ is an evaporation coefficient;
$p_{equilibrium}$ and p are equilibrium pressure at a temperature of the surface and a hydrostatic pressure acting on the surface, respectively;
m is a mass of subliming material;
k is Boltzmann's constant; and
T is the temperature of the surface.

As the sublimation surface area As of deposition material 35 in FIG. 3C varies with time and with space across lower pocket surface 252, the rate at which deposition material 35 sublimes into pocket 250 and onto substrate 10 also varies with time and with space across lower surface 12 of substrate 10. Therefore, after long deposition periods, a temporally- and spatially-varying sublimation rate of deposition material 35 can result in transients in the deposition vapor flux incident on substrate 10, and as such, non-uniform deposition rates on substrate 10.

FIG. 7A is a partial cross-sectional view of an exemplary thermal sublimation source block 740 for use in a heated pocket deposition process station, according to an embodiment of the present invention. For example, thermal sublimation source block 740 (hereinafter referred to as source block 740) can be incorporated into vacuum processing station 200 of FIG. 3C and may replace source block 240 during processes (iv) and (v) described above.

Similar to source block 240, source block 740 can be constructed from block of any number of materials having a relatively low level of impurity, a relatively high thermal conductivity, and a relatively low level of porosity to prevent adsorption of air and water vapor. For example, and as described above, source block 740 may be constructed from purified, pyrolitic-grade graphite. However, in additional embodiments, appropriate metals and metals coated with ceramics, as well as other suitable materials apparent to one skilled in the art, can form source block 740.

A pocket 750 is formed within source block 740 using any of a number of techniques appropriate to the material from which source block 740 is constructed, including, but not limited to milling, cutting, etching, or any additional technique apparent to one skilled in the art. Pocket 750 extends from surface 742 of source block 740 to a pocket depth, $D_{POCKET}$, and is defined by lower pocket surface 752 and pocket walls 754 and 756. Pocket 750 is formed within source block 740 such that lower pocket surface 752 is substantially parallel to upper surface 742 of pocket 740 and such that pocket walls 754 and 756 are respectively substantially perpendicular to lower pocket surface 752 and lower surface 742. In an embodiment, pocket depth $D_{POCKET}$ may range from about 0.5 inches to about 2.0 inches, although in additional embodiments, the specified pocket depth may exceed this particular range without departing from the spirit or scope of the present invention.

An array of holes, shown generally at 760, is formed in source block 740. Each respective hole within array 760, such as hole 770, extends into source block 740 from lower surface 752 to a hole depth, $D_{HOLE}$, and an axis of symmetry of each respective hole within array 760 is aligned substantially parallel with a vertical Z axis and substantially perpendicular to lower pocket surface 752. Further, holes within array 760 are arranged in a regular pattern across lower pocket surface 752 and, in an embodiment, can be disposed along lower surface 752 such that each respective hole is equidistant from any adjacent hole. Holes of array 760 can formed into source block 740 using any of a number of techniques apparent to one skilled in the art and appropriate to the material of source block 740, including, but not limited to, drilling and etching.

FIG. 7B is an overhead sectional view of thermal sublimation source block 740 taken along section G-G of FIG. 7A, according to an embodiment of the present invention. In FIG. 7B, pocket 750 is formed within upper surface 742 of source block 740 and is bounded by pocket walls 754, 756, 758, and 759. As described above, array 760 of holes is formed within lower surface 752 (not shown) of pocket 750. Individual holes within array 760 are disposed within pocket 750 such that each individual hole is equidistant from any adjacent hole Each individual hole within array 760 houses a plug of deposition material, such as deposition material 35 in FIG. 3C. The respective plugs of deposition material can include, but are not limited to, pressed powdered semiconductor material such as CdS or CdTe, halogen-containing compounds such as cadmium chloride ($CdCl_2$), or metal salts such as cupric chloride (CuCl). The depth of each individual hole, $D_{HOLE}$, is determined such that a corresponding plug of deposition material is of sufficient depth to allow for sublimation of the deposition material over an extended time period. For example, a thickness of a CdTe film necessary to produce a high-quality PV module is about of 2 µm. Given such a thickness, a plug of CdTe deposition material several inches in height (e.g., about two inches to about four inches) can provide an operating time of at least 300 hours. As such, deposition over extended time periods afforded by the plugs of deposition material substantially reduces down time needed to reload the sublimation material into the vacuum process station of FIG. 3C.

As described above in reference to FIG. 3C, a substrate 10, such as a soda lime glass substrate with a TCO coating, can be indexed by a pair of continuous metal strip belts 6A and 6B to cover and effectively seal pocket 750. Although not depicted in FIG. 7A, source block 740 may be heated with a heat source amenable to high-temperature operation in vacuum, such as quartz-halogen IR lamp of FIG. 3C, to a temperature sufficient to sublime the deposition material within corresponding plugs of each individual hole in array 760 at a constant rate while maintaining a constant sublimation surface area. As such, the flux of vaporized deposition material will be spatially uniform across lower surface 752 of pocket 750 and will be temporally uniform over an extended deposition period, thereby depositing material onto lower surface 12 of substrate 10 at a uniform rate.

FIG. 8A is an overhead view of an exemplary hole within array 760 of holes in FIGS. 7A and 7B, according to an embodiment of the present invention. In FIG. 8A, a hole, such as hole 770 of array of holes 760, extends into source block 740 from lower surface 752 of pocket 750 (not shown). In FIG. 8A, an axis of symmetry 892 of hole 770 is disposed substantially parallel to a vertical Z axis, (and therefore, substantially perpendicular to lower pocket surface 752), and hole 770 can extend into source block 740 for several inches. Hole 770 houses a plug of deposition material 880 that, upon heating of source block 740, sublimates from hole 770 and contributes to the flux of vaporized deposition material to be deposited onto substrate 10, as described above.

FIG. 8B is a section view of hole 770 taken along section H-H of FIG. 8A. As described in FIG. 8A, hole 770 extends from lower surface 752 of pocket 750 (not shown) to a depth, $D_{HOLE}$, of approximately several inches. Hole 770 is positioned within source block 740 such that axis of symmetry 892 of hole 770 is parallel to the vertical Z axis. Further, as described above, hole 770 houses plug 880 of deposition, and as the deposition material sublimes and contributes to the vapor flux, a surface 882 of plug 880 regresses into hole 770.

FIG. 8C depicts a cutaway view of hole 770 extending into a portion of source block 740, according to an embodiment of the present invention. As described above, hole 770 extends from lower surface 752 of pocket 750 (not shown) to a hole depth of approximately several inches, and axis of symmetry 892 of hole 770 is disposed parallel to a vertical Z axis (and therefore, substantially perpendicular to lower pocket surface 752).

Prior to sublimation, surface 882 of plug 880 is substantially coincident with lower surface 752 (e.g., surface 882 and lower surface 752 are substantially co-planar), and an area of surface 882 is substantially equivalent to cross-sectional area 772 of hole 770. However, during a deposition process (e.g., processes (iv) and (v) described above), molecules of deposition material sublime away from surface 882 of plug 880, and surface 882 subsequently and continuously regresses into hole 770 throughout the deposition process. However, unlike deposition material 35 described above in reference to FIG. 3C, the area of surface 882 remains substantially constant while surface 882 regresses into hole 770, thereby preserving a substantially constant sublimation surface area for plug 880 throughout the deposition process.

FIG. 9 schematically illustrates a process for estimating a radiation shape factor for radiative transfer between substrate 10 and sublimation surface 882, according to an embodiment of the present invention. In FIG. 9, substrate 10 is positioned above hole 770, which houses a plug of deposition material having surface 882 and which has an entrance surface area 774 substantially equivalent to cross sectional area 772 of FIG. 8C. An area of substrate 10, shown generally at 902, irradiates entrance surface area 774 and sublimation surface area 882, thereby heating the substrate and partially driving the sublimation of the deposition material. As described above, sublimation surface 882 regresses into hole 770 during a deposition process while maintaining a substantially uniform sublimation surface area.

Unlike the radiative transfer characteristic of deposition material 35 in FIG. 3C, substrate 10 no longer has an unobstructed "view" of sublimation surface 882 during the entire deposition process, since surface 882 regresses into hole 770.

As such, a radiation shape factor between substrate 10 and sublimation surface 882 is no longer substantially equal to unity.

The radiative transfer between substrate 10 and continuously-regressing surface 882 can be estimated using a composite shape factor for the system, as follows:

$$F_{10 \to 882} = F_{10 \to 774} \times F_{774 \to 882}. \quad (3)$$

In equation (3), a radiation shape factor between substrate 10 and continuously-regressing sublimation surface 882, $F_{10 \to 882}$, can be estimated as the product of radiation shape factor between substrate 10 and entrance surface area 774 of hole 770, $F_{10 \to 774}$, and a shape factor between entrance surface area 772 of hole 770 and sublimation surface area 882, $F_{774 \to 882}$.

As depicted in FIG. 9, area 902 is substantially larger than entrance surface are 774, and as such, only a small fraction of energy irradiated from area 902 falls incident onto entrance surface area 774. As such, $F_{10 \to 774}$ is generally much smaller than unity. Further, shape factor $F_{774 \to 882}$ describing radiative transfer between entrance surface area 772 and sublimation surface 882 is less than unity and decreases as sublimation surface 882 regresses into hole 770 (e.g., as a distance separating surfaces 774 and 882 increases). Therefore, the composite shape factor $F_{10 \to 774}$ that characterizes the radiative transfer between substrate 10 and sublimation surface 882 will be much smaller than unity and substantially constant during even an extended deposition process.

Shape factor $F_{10 \to 774}$ is substantially smaller than the near-unity shape factor that characterizes radiative transfer between substrate 10 and deposition material 35 deposited along lower surface 252 of pocket 250, as depicted in FIG. 3C. As such, and in contrast to the embodiment of FIG. 3C, radiative transfer between substrate 10 and sublimation surface 882 is limited during the deposition process, and a temperature of sublimation surface 882 is not substantially affected by radiation from substrate 10, even in those deposition processes when a temperature of substrate 10 is larger than the temperature of sublimation surface 882. Further, as shape factor $F_{10 \to 774}$ for each hole in array 770 is substantially constant throughout the deposition process, the heat transfer characteristics between substrate 10 and source block 740 are temporally uniform during the deposition process and spatially uniform across lower pocket surface 752 of source block 740.

In addition, and as described above, a sublimation surface area of each hole in array 760 remains substantially constant during the deposition process. As such, a total sublimation surface area of deposition material within array 760 of source block 740 remains substantially constant during the deposition process. Therefore, unlike the source block 240 described above in FIG. 3C, an overall sublimation rate of deposition material within source block 740 remains substantially constant during the deposition process, and a corresponding sublimation rate, as described by the Hertz-Knudsen equation, is determined primarily by a temperature of each hole within array 760 that surrounds a corresponding plug of sublimation material. Under such circumstances, transients in a flux of vaporized deposition material are substantially eliminated through extended deposition, resulting in a temporally- and spatially-uniform rate of material deposition onto substrate 10, in contrast to the transient effect observed when depositing material from source block 240 of FIG. 3C for extended periods.

One potential disadvantage to sublimating deposition material from holes in sublimation blocks, such as array 760 of holes in source block 740, is that inner surfaces of the holes can impart a directionality to the sublimating vapor flux. For example, and referring to FIG. 7A, an inner surface 776 of hole 770 may collimate sublimating vapor into a vapor flux having a distinct directionality. Such directional effects, often referred to as "beaming," can reduce gas scattering between molecules of vapor flux and surrounding gas and can lead to locally-heavy deposition rates of sublimating material and significant non-uniformities in thin-film layers deposited onto substrates.

Thermal sublimation source block 740 substantially reduces or eliminates any "beaming" of sublimating vapor from holes within array 760 by maintaining an ambient pocket pressure of approximately 40 torr and by establishing a source-to-substrate distance, which separates lower pocket surface 752 from lower surface 10B of substrate 10 (e.g., a sum of $D_{POCKET}$ and separation distance 721 in FIG. 7A), ranging from about 0.5 inches to about two inches. Such a combination of ambient pocket pressure and source-to-substrate distance combine to foster gas scattering as molecules and atoms of the sublimating vapor traverse the source-to-substrate distance. The fostered gas scattering within the flux of sublimating vapors results in non-directional vapor transport, thereby substantially reducing or eliminating any beaming effects resulting from sublimation of deposition material in individual holes of array 760, and resulting in greater uniformity in both the vapor deposition flux and the deposition process.

Further, as described above, gas scattering within a flux of sublimating vapor can result in "thermalization" of molecules and atoms of sublimating deposition material. Thermalization effects can reduce energy levels among affected molecules and atoms, thereby fostering condensation of these species into nano-particles of sublimed material. However, thermal sublimation source block 740 substantially reduces or eliminates any thermalization of sublimed deposition material, as ambient gas within pocket 750 is heated to an elevated temperature by source block 740 and sealed within pocket by substrate 10, as described above.

In the embodiments described herein, an apparatus for manufacturing CdTe/CdS thin-film photovoltaic modules incorporates a thermal sublimation source block having an array of holes positioned along a lower surface of a pocket to house deposition material. In such an embodiment, the thermal sublimation source block allows for uniform deposition of thin-films on substrates over extended deposition periods. In its various embodiments, the thermal sublimation source block described herein (i) substantially reduces or eliminates thermal radiation from a hot substrate that heats deposition material and causes an uncontrolled sublimation of the material; (ii) maintains a thermal radiation shape factor that determines thermal radiation input to the sublimation material from the surrounding source block that is substantially constant; (iii) maintains a sublimation surface area that is substantially constant as the deposition material sublimes away; and (iv) allows sublimation vapor to be scattered by collisions with the ambient gas in the pocket leading to a more uniform vapor flux.

Exemplary Methods for Fabricating CdTe/CdS Thin-Film Photovoltaic Modules

FIG. 10A is a flowchart of an exemplary process 1000 for manufacturing a CdTe/CdS thin-film photovoltaic module, according to an embodiment of the invention. In an embodiment, process 1000, as described herein, can be performed using apparatus 100 of FIG. 1 that incorporates exemplary thermal sublimation source block 740 of FIGS. 7A and 7B.

In step 1002, a substrate is cleaned and prepared for additional processing in a vacuum chamber. The cleaning and preparation process of step 1002 can include ultrasonically cleaning the substrate, rinsing the substrate in a polar solvent, including but nor limited to isopropyl alcohol, to remove excess water from one or more surfaces of the substrate, and drying the rinsed substrate within an environment substantially similar to a clean room. In an embodiment, the substrate may be soda-lime glass having a transparent conducting oxide (TCO) coating on one surface, although additional substrate materials and coatings may be used without departing from the spirit or scope of the present invention.

In step 1004, the substrate is transported into the vacuum chamber for processing. In an embodiment, a pair of continuous metal strip belts, such as belts 6A and 6B of FIG. 1, transports the substrate into the vacuum chamber through an air-to-vacuum-to-air opening.

Once within a vacuum environment, the substrate is heated to an elevated temperature in step 1006. In an embodiment, step 1006 may heat the substrate top a temperature ranging from about 500° C. to about 560° C. While at such an elevated temperature (e.g., about 500° C. to about 560° C.), step 1008 deposits a CdS layer onto the TCO coating of the substrate, and step 1010 subsequently deposits a CdTe film onto the CdS layer on the substrate.

Once CdS and CdTe layers have been deposited into TCO coating to form a film stack on the substrate, the CdS/CdTe layers are treated in steps 1012 and 1014 with cadmium chloride ($CdCl_2$) to improve efficiency in the resulting CdS/CdTe photovoltaic modules. In step 1012, the substrate is cooled to a temperature ranging from about 300° C. to about 500° C. (or alternatively, maintained at 500° C.) and exposed to $CdCl_2$ in vapor form, liquid form, or combinations thereof. Further, in an embodiment, step 1012 may be repeated across multiple processing stations within the vacuum chamber to complete the initial exposure of the substrate to $CdCl_2$.

Step 1014 subsequently adjusts heats or cools the substrate to a temperature range from about 400° C. to about 450° C. to anneal the treated CdTe and CdS layers on the substrate and remove any $CdCl_2$ film on the film stack, thereby completing the $CdCl_2$ exposure process. In an embodiment, step 1014 may be repeated across multiple processing stations within the vacuum chamber to complete the annealing process.

Once treated in steps 1012 and 1014, the substrate and film stack are cooled in step 1016 to a temperature ranging from about 25° C. to about 100° C. Steps 1018 and 1020 subsequently form an ohmic low-resistance contact on a surface of the CdTe layer.

In step 1018, the substrate and film stack are heated to a temperature ranging from about 150° C. to about 300° C., and a metal salt is deposited onto the CdTe layer of the substrate. In an embodiment, step 1018 may deposit copper (I) chloride (CuCl) onto the CdTe layer, although in additional embodiments, step 1018 may deposit any of a number of appropriate metal salts apparent to one skilled in the art onto the CdTe layer. Step 1020 subsequently anneals the CdS/CdTe/metal salt layers on the substrate at a temperature ranging from about 150° C. to about 300° C. In an embodiment, step 1020 can be repeated across multiple processing stations within the vacuum chamber to complete the annealing process.

In combination, steps 1018 and 1020 produce a reaction between the metal salt and the surface of the CdTe layer, thereby producing a thin p+ semiconductor layer on the CdTe surface to form the ohmic contact. For example, if step 1018 were to deposit a copper salt in step 1018 (e.g., CuCl), the reaction may form a copper telluride (e.g., $CuTe_x$), copper-doped CdTe (CdTe:Cu), or combinations thereof. In such an embodiment, the thin p+ layer provides a stable, low resistance ohmic contact on the surface of the CdTe layer.

Step 1022 subsequently cools the substrate and the film stack to a temperature ranging from about 25° C. to about 100° C. In an embodiment, the cooling process of step 1022 may be repeated across one or more processing stations within the vacuum chamber.

After cooling in step 1022, the substrate is transported in step 1024 from the vacuum chamber into the ambient atmosphere. In an embodiment, the pair of continuous metal strip belts transports the substrate into from vacuum chamber and into the ambient atmosphere through a second air-to-vacuum-to-air opening.

In step 1026, one or more of first scribing operations are performed on the substrate and film stack. In an embodiment, the one or more of first scribing operations scribe through all layers of the film stack, and any TCO coating on the substrate, to generate a first set of scribes. Once the first scribing process is complete, a second scribing performed on the substrate to generate a second set of scribes parallel to the first set of scribes. In an embodiment, the second scribing process scribes through all layers of the film stack, but not the TCO coating. Further, both first and second scribing processes may be performed by a scribing station outside of the vacuum environment, such as first scribing process station 18A of FIG. 1 using the exemplary processes of FIGS. 9A and 9B.

Step 1028 then applies a conductive coating onto the previously-scribed carbon-containing coating to form a metallization layer. In an embodiment, the conductive coating may contain nickel (Ni), molybdenum (Mo), or combinations of nickel, molybdenum, and other appropriate metals apparent to one skilled in the art. Further, the conductive coating may be deposited onto the film stack in step 1028 by sputtering (e.g., by sputtering station 16 of FIG. 1). Since the metallization layer is formed after the second set of scribes, the conductive coating fills the cuts in the semiconductor layers from the second scribe. As such, step 1028 results in an electrical connection of between a back electrode of one cell to a front electrode of another cell.

Step 1030 then perform a third scribing process to generate a plurality of third scribes through the metallization layer of step 1028. Step 1030 may perform a plurality of third scribes through the metallization layers (e.g., by second scribing process station 18B of FIG. 1 using the exemplary processes of FIGS. 9A and 9B). The final scribing process applied to the metallization layer in step 1030 completes an interconnection of individual photovoltaic cells in series to form a CdTe/CdS photovoltaic module, and the resulting photovoltaic module is encapsulated in step 1032.

In an embodiment, any deposition step within exemplary method 1000, including steps 1008, 1010, 1012, and 1018 performed in vacuum, may deposit one or more using apparatus 100 and in particular, thermal sublimation source block 740 of FIGS. 7A and 7B. Further, if one layer of material were deposited in one cycle time (e.g., thirty seconds to two minutes), to a given thickness, then the deposited layer may be replaced by multiple thinner layers built up to the same given thickness over a corresponding number of depositions of respective shorter cycles. In an embodiment, multiple depositions can advantageous for commodity processing, as each decrease in cycle time is associated with a corresponding increase in production rate. Additionally, multiple processing stations, as described above, can be used to decrease a cycle time for non-deposition processing steps, including, but not limited to annealing, vapor treatment, and cooling.

In an embodiment, method 1000 may process a substrate to generate a multi-junction solar cell on the substrate. In such a structure, two or more solar cells can be stacked on a single substrate such that solar radiation passes through a larger band gap material first, and residual radiation passes through the stack to a smaller band gap material. A desired band gap of such materials needed could be tailored by using semiconductors formed by any combination of elements Zn, Cd, Hg, S, Se, Te, or any additional suitable element from group IIB and group VIB of the periodic table. In an embodiment, such semiconductors may be alloys having three or more constituent elements As described above, multiple layers of material can be deposited in vacuum by a series of processing stations incorporating thermal sublimation source block 740, and by varying a composition of the deposition material in the multiple source blocks, a graded band gap photovoltaic device may be fabricated.

In various embodiments, exemplary method 1000 may manufacture CdTe/CdS photovoltaic small area devices having respective surface areas of 0.3 cm². For example, masking certain areas and removing the rest of the films on the substrates with an abrasive blast, as described above in reference to FIG. 9B, may define such devices. Further, for example, such small area devices can be formed on commercially-available, low-cost $SnO_x$:F coated soda lime glass, and these small area devices can exhibit conversion of approximately 11.8%. Accelerated stress testing, by light soaking the produced CdTe/CdS photovoltaic small area devices with radiation of 1000 W/m² and 65° C. at open circuit conditions, indicates measured device efficiencies of the produced photovoltaic small area devices were at least 98% of original efficiencies over time period of hundreds of hours.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An apparatus for depositing material on a substrate, the apparatus comprising:
    a source block for exposing a substrate to sublimating vapor in a vacuum, the source block comprising:
    a first surface of the source block disposed proximate to a surface of the substrate;
    an open cavity formed into the first surface of the source block and extending into the source block to form a second surface, the second surface of the source block being substantially parallel to the first surface of the source block;
    a plurality of holes respectively formed into the second surface of the source block and respectively extending into the source block for a specified distance; and
    material positioned within each of the plurality of holes to be sublimated during exposure of the substrate, the material in each of the plurality of holes having a corresponding initial sublimation surface area, the material positioned such that the top of the material is below the second surface;
    wherein the plurality of holes are configured such that a sublimation surface area of the material within each of the plurality of holes is substantially equivalent to the corresponding initial sublimation source area as the material regresses into the plurality of holes; and
    the source block is configured such that radiative heat transfer between a portion of the surface of the substrate and the material within each of the plurality of holes is substantially constant as the material regresses into the plurality of holes.

2. The apparatus of claim 1, wherein the first surface of the source block is separated from the second surface of the source block by a distance ranging from about 0.5 inches to about 2.0 inches.

3. The apparatus of claim 1, wherein the source block is configured such that a thermal radiation shape factor between the portion of the surface of the substrate and the sublimation surface area of the material within each of the plurality of holes is substantially constant as the material regresses into the plurality of holes.

4. The apparatus of claim 1, wherein the plurality of holes are disposed in the second surface of the source block such that each hole of the plurality of holes is equidistant from any adjacent hole.

5. The apparatus of claim 1, wherein the plurality of holes are disposed in the lower surface of the source block such that an axis of symmetry of each of the plurality of holes is perpendicular to the second surface of the source block.

6. The apparatus of claim 1, wherein the material within each of the plurality of holes comprises powdered material pressed into each of the plurality of holes to form a corresponding plug of powdered material in each of the plurality of holes.

7. The apparatus of claim 1, wherein the material within each of the plurality of holes is a first semiconductor material, a second semiconductor material, a halogen-containing substance, or a metal salt.

8. The apparatus of claim 7, wherein the first semiconductor material is cadmium sulfide (CdS), and the second semiconductor material is cadmium telluride (CdTe).

9. The apparatus of claim 1, wherein the material sublimated from each of the plurality holes is deposited onto the surface of the heated substrate at a substantially-constant deposition rate to form a layer of deposited material on the surface of the substrate.

10. The apparatus of claim 1, further comprising:
    a heat source configured to apply a heat flux to the source block to sublimate the material within each of the plurality of holes, wherein the heat source and source block are configured such that a rate of sublimation of the material within each of the plurality of holes is substantially constant during exposure of the substrate.

11. The apparatus of claim 10, wherein the material within each of the plurality of holes comprises powdered material pressed into each hole of the plurality of holes to form a corresponding plug of powdered material in each hole of the plurality of holes.

12. The apparatus of claim 11, wherein the plug of powdered material maintains the substantially-constant sublimation rate for at least 300 hours.

13. The apparatus of claim 12, wherein the plurality of holes are disposed in the second surface of the source block such that each hole of the plurality of holes is equidistant from any adjacent hole.

14. The apparatus of claim 10, further comprising:
a vacuum chamber comprising a plurality of vacuum process stations respectively configured to expose a heated substrate to a sublimating vapor, wherein at least one of the plurality of vacuum processing stations comprises the source block and the heat source; and
a substrate transport system configured to transfer the substrate into the vacuum chamber prior to exposure to the sublimating vapor and to transfer the substrate through the plurality of vacuum process stations and to transfer the substrate out of the vacuum chamber after exposure to the sublimating vapor.

15. The apparatus of claim 14, wherein the vacuum chamber further comprises one or more additional vacuum stations configured to (i) heat a substrate to a temperature within a pre-determined range of temperatures or (ii) cool the heated substrate to a temperature within a pre-determined range of temperatures.

16. The apparatus of claim 14, wherein each of the plurality of vacuum processing stations are configured to: (i) deposit a layer of a first semiconductor material onto the heated surface of the substrate at a substantially-constant deposition rate; (ii) deposit a layer of a second semiconductor material onto a previously-deposited layer of the first semiconductor material at a substantially-constant deposition rate; (iii) expose one or more previously-deposited layers of semiconductor material to a halogen-containing substance; or (iv) deposit a layer of a metal salt onto one or more previously-deposited layers of semiconductor material at a substantially-constant deposition rate.

17. The apparatus of claim 16, wherein the first semiconductor material is cadmium sulfide (CdS) and the second semiconductor material is cadmium telluride (CdTe).

18. The apparatus of claim 14, further comprising a plurality of additional processing stations configured to process the exposed substrate outside of the vacuum chamber to form a photovoltaic module.

19. The apparatus of claim 18, wherein the plurality of additional processing stations comprise:
one or more sputtering stations configured to sputter a metal back electrode onto the exposed substrate;
one or more scribing stations configured to scribe a previously-sputtered substrate; and
an encapsulation station configured to apply a protective back glass and edge encapsulation onto the scribed substrate.

20. The apparatus of claim 1, further comprising:
a vacuum chamber comprising a plurality of vacuum process stations respectively configured to expose a heated substrate to a sublimating vapor, wherein at least one of the plurality of vacuum processing stations comprises the source block; and
a substrate transport system configured to transfer the substrate through the plurality of vacuum process stations and to transfer the substrate into the vacuum chamber prior to exposure to the sublimating vapor and to transfer the substrate out of the vacuum chamber after exposure to the sublimating vapor.

21. The apparatus of claim 20, wherein the vacuum chamber further comprises one or more additional vacuum stations configured to (i) heat a substrate to a temperature within a pre-determined range of temperatures or (ii) cool the heated substrate to a temperature within a pre-determined range of temperatures.

22. The apparatus of claim 20, wherein each of the plurality of vacuum processing stations are configured to: (i) deposit a layer of a first semiconductor material onto the heated surface of the substrate at a substantially-constant deposition rate; (ii) deposit a layer of a second semiconductor material onto a previously-deposited layer of the first semiconductor material at a substantially-constant deposition rate; (iii) expose one or more previously-deposited layers of semiconductor material to a halogen-containing substance; or (iv) deposit a layer of a metal salt onto one or more previously-deposited layers of semiconductor material at a substantially-constant deposition rate.

23. The apparatus of claim 22, wherein the first semiconductor material is cadmium sulfide (CdS) and the second semiconductor material is cadmium telluride (CdTe).

24. The apparatus of claim 20, further comprising a plurality of additional processing stations configured to process the exposed substrate outside of the vacuum chamber to form a photovoltaic module.

25. The apparatus of claim 18, wherein the plurality of additional processing stations comprise:
one or more sputtering stations configured to sputter a metal back electrode onto the exposed substrate;
one or more scribing stations configured to scribe a previously-sputtered substrate; and
an encapsulation station configured to apply a protective back glass and edge encapsulation onto the scribed substrate.

26. The apparatus of claim 20, wherein the substrate transport system comprises a pair of continuous metal strip belts.

* * * * *